United States Patent
Maeda et al.

(10) Patent No.: US 12,088,257 B2
(45) Date of Patent: Sep. 10, 2024

(54) HIGH-FREQUENCY AMPLIFIER

(71) Applicant: Nuvoton Technology Corporation Japan, Kyoto (JP)

(72) Inventors: Masahiro Maeda, Osaka (JP); Masatoshi Kamitani, Osaka (JP); Shingo Matsuda, Kyoto (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 466 days.

(21) Appl. No.: 17/488,240

(22) Filed: Sep. 28, 2021

(65) Prior Publication Data

US 2022/0021344 A1 Jan. 20, 2022

Related U.S. Application Data

(63) Continuation of application No. PCT/JP2019/050729, filed on Dec. 25, 2019.
(Continued)

(51) Int. Cl.
*H03F 1/02* (2006.01)
*H03F 1/56* (2006.01)
*H03F 3/24* (2006.01)

(52) U.S. Cl.
CPC ........... *H03F 1/0288* (2013.01); *H03F 1/565* (2013.01); *H03F 3/245* (2013.01); *H03F 2200/387* (2013.01); *H03F 2200/451* (2013.01)

(58) Field of Classification Search
CPC ........ H03F 1/0288; H03F 1/565; H03F 3/245; H03F 2200/387; H03F 2200/451
(Continued)

(56) References Cited

U.S. PATENT DOCUMENTS 8,611,834 B2 * 12/2013 Harris ............... H03H 7/40
455/107
2006/0097783 A1 5/2006 Okubo et al.
(Continued)

FOREIGN PATENT DOCUMENTS

JP 2006-157900 A 6/2006
JP 2006-311300 A 11/2006
(Continued)

OTHER PUBLICATIONS

International Search Report corresponds to International Patent Application No. PCT/JP2019/050729, dated Mar. 17, 2020, with English translation.

*Primary Examiner* — Hieu P Nguyen
(74) *Attorney, Agent, or Firm* — Rimon P.C.

(57) ABSTRACT

A high-frequency amplifier includes: a carrier amplifier which amplifies a first signal; a peak amplifier which amplifies a second signal; a first matching circuit which is connected to the output terminal of the carrier amplifier; a second matching circuit which is connected to the output terminal of the peak amplifier; a first transmission line which is connected between the first matching circuit and the second matching circuit, and has an electric length that is less than ¼ of the wavelength of the center frequency of a predetermined frequency band. The phase rotation by a series inductor which is included in each of the first matching circuit and the second matching circuit and has one end that has been grounded is opposite to the phase rotation by the first transmission line.

11 Claims, 18 Drawing Sheets

Related U.S. Application Data

(60) Provisional application No. 62/827,637, filed on Apr. 1, 2019.

(58) Field of Classification Search
USPC .............................. 330/295, 124 R, 76, 302
See application file for complete search history.

(56) References Cited

U.S. PATENT DOCUMENTS

| | | |
|---|---|---|
| 2013/0135053 A1 | 5/2013 | Tamanoi et al. |
| 2016/0173039 A1 | 6/2016 | Frei et al. |
| 2018/0167042 A1 | 6/2018 | Nagasaku |
| 2018/0331871 A1 | 11/2018 | Martinez |
| 2019/0028062 A1 | 1/2019 | Shinjo et al. |
| 2020/0091871 A1 | 3/2020 | Nakatani et al. |

FOREIGN PATENT DOCUMENTS

| | | |
|---|---|---|
| JP | 2013-110660 A | 6/2013 |
| JP | 2014-197755 A | 10/2014 |
| JP | 2016-63291 A | 4/2016 |
| WO | 2016/203512 A1 | 12/2016 |
| WO | 2017/145258 A1 | 8/2017 |
| WO | 2018/138763 A1 | 8/2018 |

* cited by examiner

FIG. 2
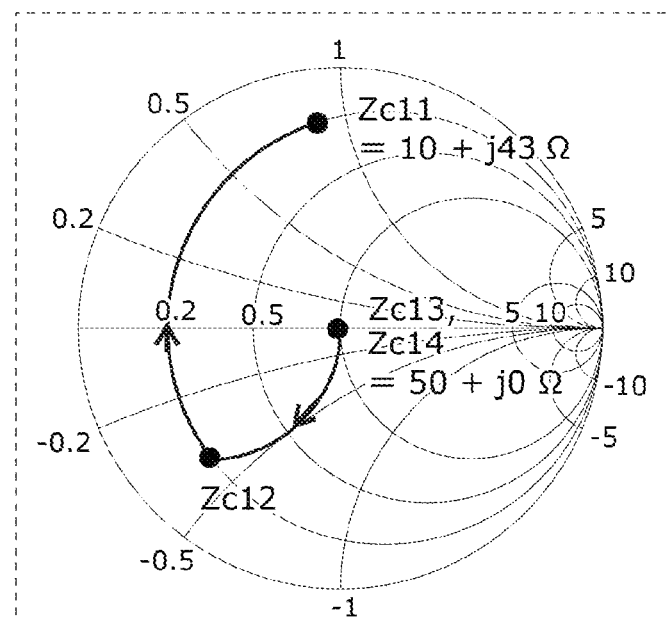
(a) When PA is on
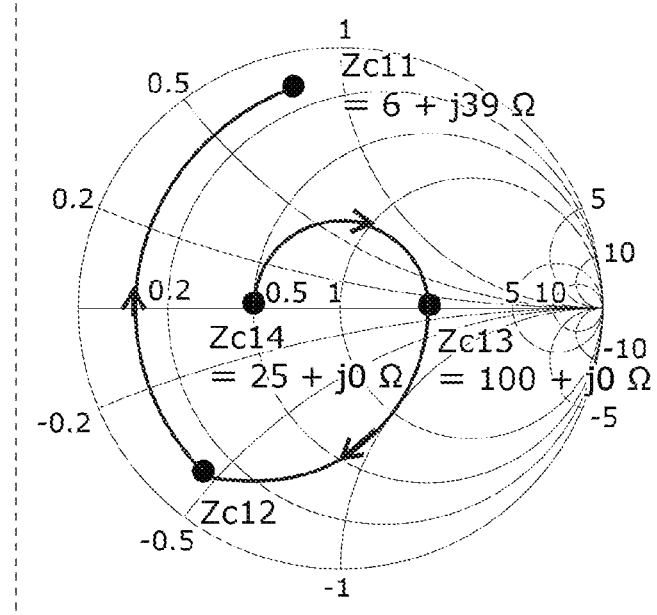
(b) When PA is off

Frequency: 4 GHz to 5 GHz

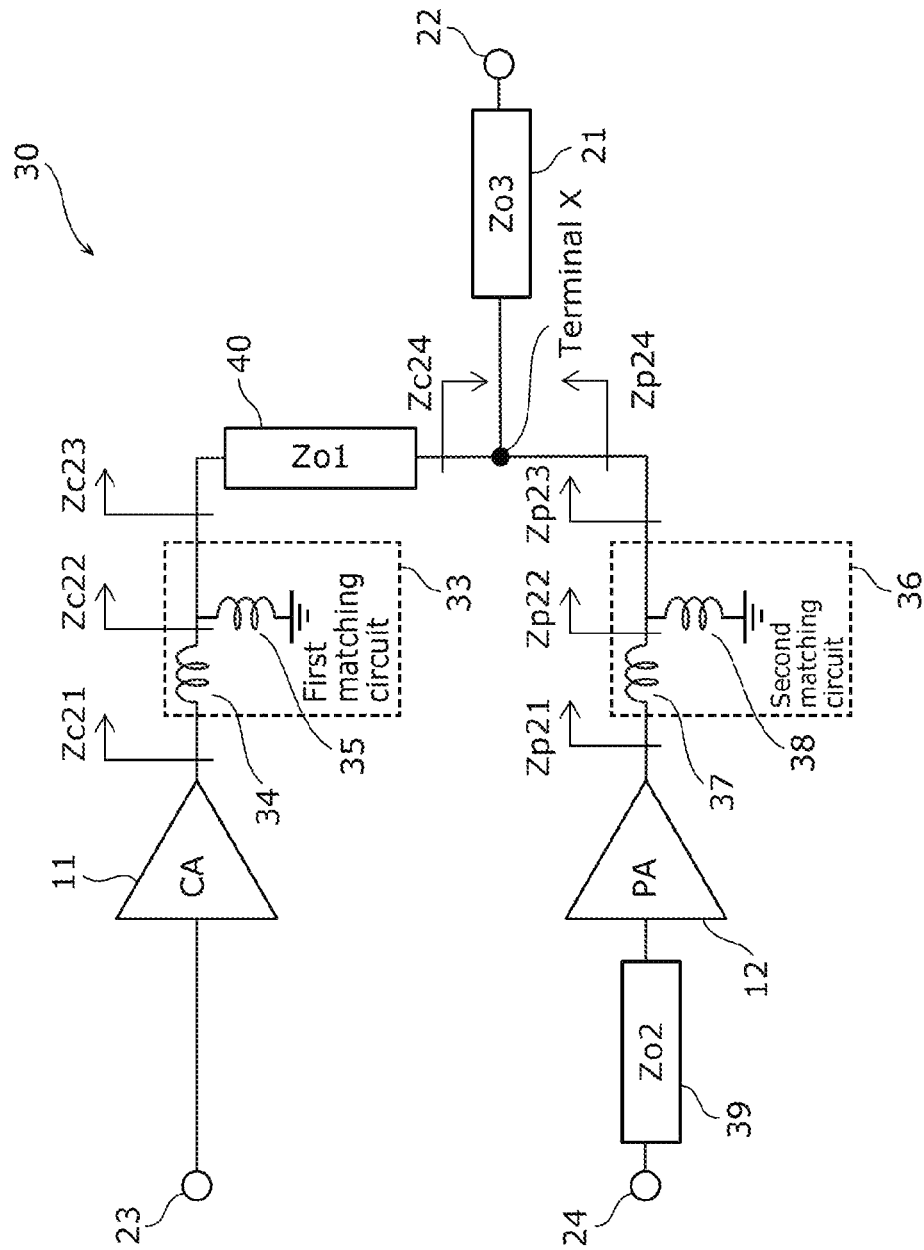

FIG. 7
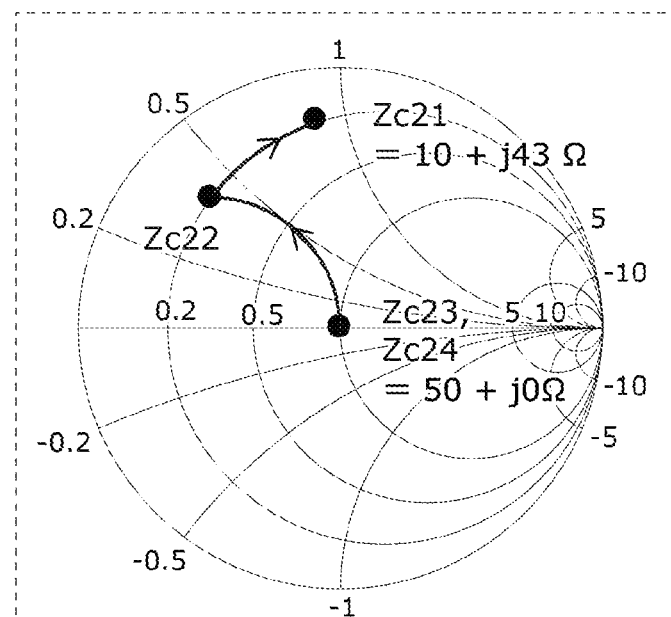
(a) When PA is on
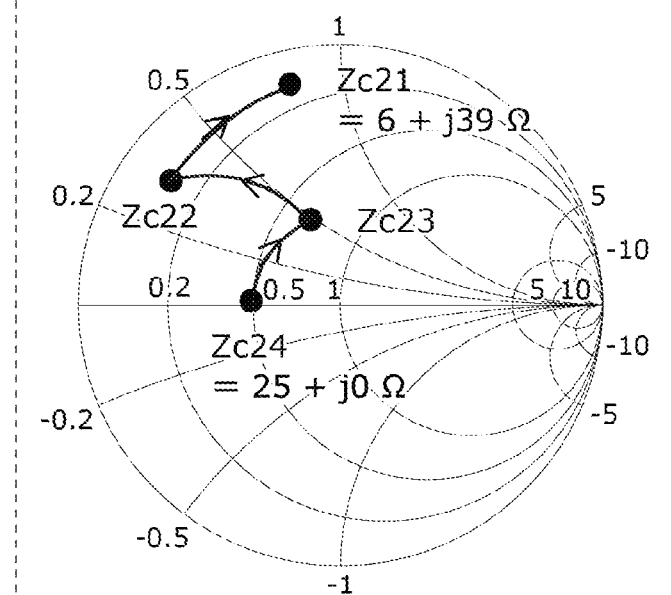
(b) When PA is off (a) For carrier amplifier   (b) For peak amplifier

HIGH-FREQUENCY AMPLIFIER

CROSS REFERENCE TO RELATED APPLICATIONS

This is a continuation application of PCT International Application No. PCT/JP2019/050729 filed on Dec. 25, 2019, designating the United States of America, which is based on and claims priority of U.S. Provisional Patent Application No. 62/827,637 filed on Apr. 1, 2019. The entire disclosures of the above-identified applications, including the specifications, drawings and claims are incorporated herein by reference in theft entirety.

FIELD

The present disclosure relates to high-frequency amplifiers, and particularly to high-frequency amplifiers represented by Doherty amplifiers.

BACKGROUND

A Doherty amplifier configured to include, in combination, a carrier amplifier that performs an AB-class operation or a B-class operation and a peak amplifier that performs C-class operation has been known as a highly-efficient high-frequency amplifier for use in radio communication, etc. In the Doherty amplifier, only the carrier amplifier operates in an operation area in which output power is low, both the carrier amplifier and the peak amplifier operate in an operation area in which output power is high, and the output signals of the carrier amplifier and the peak amplifier are combined.

In order to combine the output signals, in the Doherty amplifier, a first transmission line is connected between the output terminal of the carrier amplifier and the output terminal of the peak amplifier. The first transmission line has an electric length that is ¼ of the wavelength of the center frequency of a communication frequency band. Here, as problems that occur when the first transmission line having the ¼ wavelength is used, there are following problems: decrease in wide-band characteristics caused by dispersion of the load impedance of the carrier amplifier; decrease in efficiency caused by increase in the loss of high-frequency power; and furthermore, increase in the circuit scale because of increase in the length of the transmission line. It is to be noted that a "load impedance" of a certain circuit element is an impedance in the case where the output side (that is, the load side) is seen from the circuit element. In addition, "dispersion" means a frequency dependence, and "to disperse" means that the frequency dependence increases.

In view of this, conventionally, various techniques have been proposed in order to design a Doherty amplifier which operates in a wide frequency band.

In the technique of Patent Literature 1, a second transmission line is connected between a first transmission line and the output terminal of a peak amplifier. The second transmission line has an electric length that is ½ of the wavelength of the center frequency of a communication frequency band. In this way, in an operation area in which the peak amplifier does not operate and the output power of the Doherty amplifier is low, the frequency characteristics of the load impedance of a carrier amplifier are compensated, and the wide-band characteristics of the Doherty amplifier are improved.

CITATION LIST

Patent Literature

PTL 1: Japanese Unexamined Patent Application Publication No. 2014-197755

SUMMARY

Technical Problem

However, in the technique in Patent Literature 1, in an operation area in which both the carrier amplifier and the peak amplifier operate and the output power of the Doherty amplifier is high, no output signal of the carrier amplifier flows into the second transmission line, and thus the frequency characteristics of the load impedance of the carrier amplifier are not compensated. For this reason, in such an operation area in which output power is high, there is still a problem in decrease in the wide-band characteristics of the Doherty amplifier. Furthermore, in the technique in Patent Literature 1, problems remain in decrease in the efficiency of the Doherty amplifier and increase in the circuit size. It is to be noted that an "efficiency" of an amplifier means a power conversion efficiency (that is, the ratio of an output power with respect to an input power).

In view of this, the present disclosure has an object to provide a high-frequency amplifier which operates in a wider frequency band, provides a higher efficiency, and is more compact than conventional ones.

Solution to Problem

In order to achieve the above object, a high high-frequency amplifier according to an aspect of the present disclosure is a high-frequency amplifier which amplifies a first signal and a second signal in a predetermined frequency band to output amplified signals from an output terminal. The high-frequency amplifier includes: a first amplifier which amplifies the first signal; a second amplifier which amplifies the second signal; a first matching circuit which is connected to an output terminal of the first amplifier; a second matching circuit which is connected to an output terminal of the second amplifier; a first transmission line which is connected between the output terminal of the first matching circuit and the output terminal of the second matching circuit, the first transmission line having an electric length that is less than ¼ of a wavelength of a center frequency of the predetermined frequency band; a second transmission line which is connected to one of an input terminal of the first amplifier or an input terminal of the second amplifier, the second transmission line having an electric length that is less than ¼ of the wavelength of the center frequency of the predetermined frequency band; and a third transmission line which is connected between one end of the first transmission line and the output terminal, the third transmission line having an electric length that is ¼ of the wavelength of the center frequency of the predetermined frequency band. In the high-frequency amplifier, a phase rotation by one of the first matching circuit or the second matching circuit connected to an other of the output terminal of the first amplifier and the output terminal of the second amplifier is opposite to a phase rotation by the first transmission line.

In order to achieve the above object, a high-frequency amplifier according to another aspect of the present disclosure is a high-frequency amplifier which amplifies a first signal and a second signal in a predetermined frequency band to output amplified signals from an output terminal. The high-frequency amplifier includes: a substrate; one or two semiconductor chips mounted on the substrate; a first amplifier which is disposed on the one or two semiconductor chips and amplifies the first signal; a second amplifier which is disposed on the one or two semiconductor chips and amplifies the second signal; an eighth transmission line which is disposed on the one or two semiconductor chips and has one end connected to an output terminal of the first amplifier; a ninth transmission line which is disposed on the one or two semiconductor chips and has one end connected to an output terminal of the second amplifier; a first capacitor disposed on the one or two semiconductor chips; a second capacitor disposed on the one or two semiconductor chips; a fourth transmission line which is disposed on the substrate and has one end connected to an other end of the eighth transmission line; a fifth transmission line which is disposed on the substrate and has one end connected to an other end of the ninth transmission line; a first transmission line which is connected between the one end of the fourth transmission line and the one end of the fifth transmission line which are disposed on the substrate, the first transmission line having an electric length that is less than ¼ of a wavelength of a center frequency of the predetermined frequency band; a second transmission line which is connected to one of an input terminal of the first amplifier or an input terminal of the second amplifier, the second transmission line having an electric length that is less than ¼ of the wavelength of the center frequency of the predetermined frequency band; and a third transmission line which is connected between the one end of the first transmission line and the output terminal, the third transmission line having an electric length that is ¼ of the wavelength of the center frequency of the predetermined frequency band. In the high-frequency amplifier, an other end of the fourth transmission line and the first capacitor are connected to each other, and an other end of the fifth transmission line and the second capacitor are connected to each other.

Advantageous Effects

According to the present disclosure, a high-frequency amplifier which operates in a wider frequency band, provides a higher efficiency, and is more compact than conventional ones is provided.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 2 illustrates Smith charts each indicating impedance conversion in the high-frequency amplifier according to the comparison example.

FIG. 6 is a circuit diagram of a high-frequency amplifier according to Embodiment 1.

FIG. 7 illustrate Smith charts each indicating impedance conversion in the high-frequency amplifier according to Embodiment 1.

DESCRIPTION OF EMBODIMENTS

Figure 1:
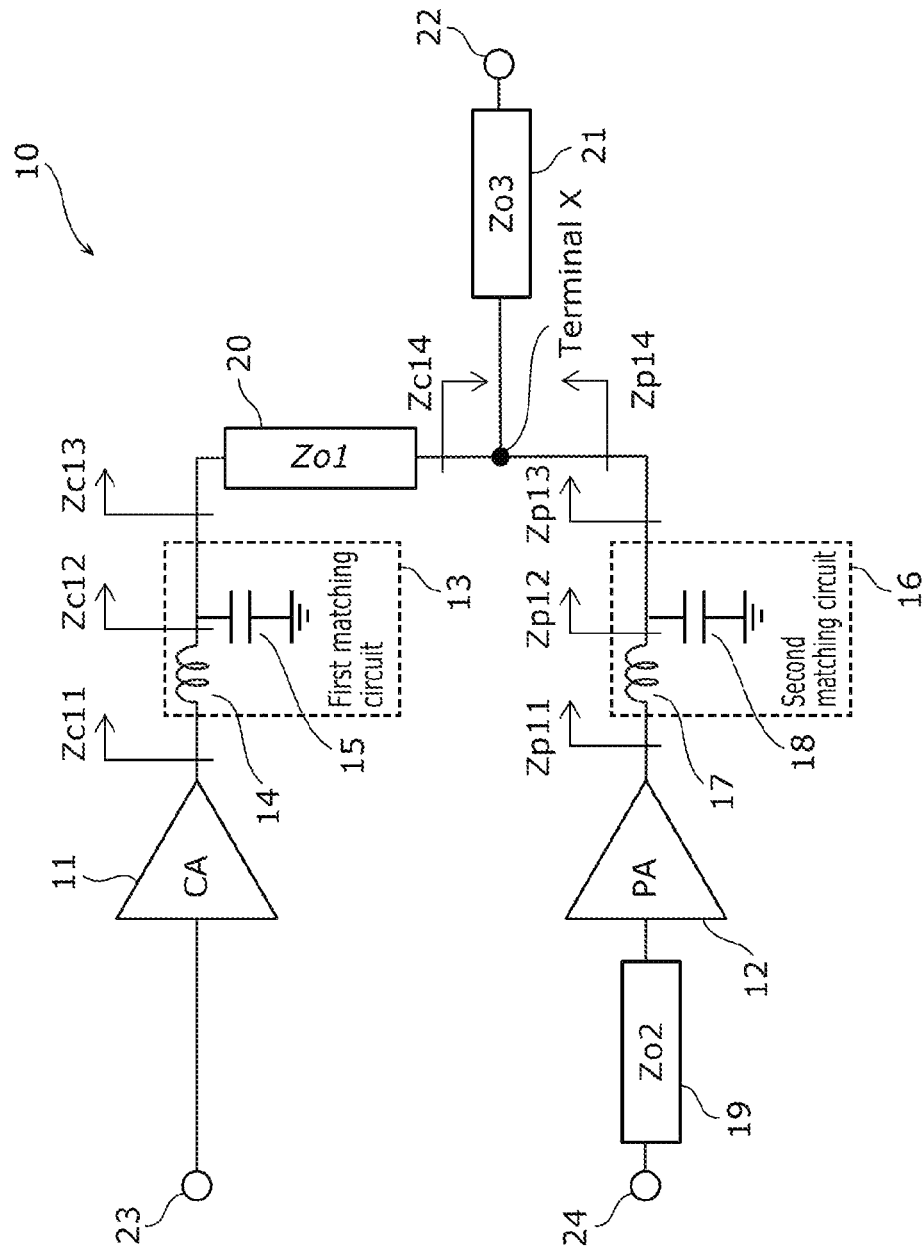
FIG. 1 is a circuit diagram of a high-frequency amplifier according to a comparison example.

FIG. 1 is a circuit diagram of high-frequency amplifier 10 according to a comparison example. Arrows and symbols Zci and Zpi (i is a numerical number) denoted near the arrows in the diagram indicate impedances (that is, load impedances) when seen from the positions of the symbols in the directions of the arrows. High-frequency amplifier 10 is a Doherty amplifier which amplifies a first signal and a second signal in a predetermined frequency band to output amplified signals from output terminal 22. High-frequency amplifier 10 includes carrier amplifier (CA) 11, peak amplifier (PA) 12, first matching circuit 13, second matching circuit 16, first transmission line 20, second transmission line 19, third transmission line 21, output terminal 22, first input terminal 23, and second input terminal 24. First matching circuit 13 includes series inductor 14 and parallel capacitor 15 whose one end is grounded. Second matching circuit 16 includes series inductor 17 and parallel capacitor 18 whose one end is grounded. It is to be noted that a "series inductor" is an inductor which is inserted on a transmission path from an input terminal to an output terminal. In addition, a "parallel capacitor" is a capacitor which is connected between a transmission path from an input terminal to an output terminal and a reference potential (that is, a ground potential). In addition, "to ground" covers not only being Direct Current (DC) grounded (that is, being DC grounded to a reference potential) but also being grounded at high frequency (that is, being connected to a reference potential via a capacitor, or the like whose impedance is extremely low in a predetermined frequency band).

Carrier amplifier 11 is an amplifier which performs an AB-class operation or a B-class operation and amplifies the first signal, and operates in the entire range of the output power of high-frequency amplifier 10. Peak amplifier 12 is an amplifier which operates a C-class operation and amplifies the second signal, and operates in an area in which the output power of high-frequency amplifier 10 is high. First transmission line 20 is connected between the output terminal of carrier amplifier 11 and the output terminal of peak amplifier 12, and has an electric length that is ¼ of the wavelength of the center frequency of the predetermined frequency band. Characteristic impedance Zo1 of first transmission line 20 is 50Ω. In high-frequency amplifier 10, the length of first transmission line 20 is as long as the ¼ wavelength, and thus there is a problem that the load dispersion of the carrier amplifier is large and the wide-band characteristics decrease. In addition, there is a problem that the loss of high-frequency power is large, and the efficiency of the amplifier decreases. In addition, increase in the circuit area becomes a problem.

Second transmission line 19 is connected to the input side of peak amplifier 12, and is set to have an electric length that is the same as the electric length of first transmission line 20 in order to compensate the phase rotation by first transmission line 20. In this case, the length of second transmission line 19 is as long as the ¼ wavelength, there are problems of the large loss of high-frequency power and decrease in amplification gain. In addition, increase in the circuit area becomes a problem. It is to be noted that the "phase rotation" by a certain circuit element is the difference between the phase angle of a signal input to the circuit element and the phase angle of a signal that is output from the circuit element (that is, the difference corresponds to a value according to (the phase angle of the output signal)−(the phase angle of the input signal)).

Now, the connection part between first transmission line 20 and second matching circuit 16 is assumed to be terminal X. Third transmission line 21 is connected between terminal X and output terminal 22, and has an electric length that is ¼ of the wavelength of the center frequency of the predetermined frequency band. Characteristic impedance Zo3 of third transmission line 21 is a value (for example, 35.36Ω) for converting an impedance (for example, 25Ω) of terminal X to an impedance (for example, 50Ω) of output terminal 22.

When peak amplifier 12 operates (when the PA is on), Zc14 is designed to have a value according to 50 Ω+j0Ω. When peak amplifier 12 does not operate (when the PA is off), Zc14 is designed to have a value according to 25 Ω+j0Ω.

Here, a description is given of a specific circuit constant in the case where GaN having a total gate width of 3 mm is used for each of carrier amplifier 11 and peak amplifier 12 in high-frequency amplifier 10. In the center frequency of 4.5 GHz of a predetermined frequency band, the optimum characteristics are obtained by making the following settings of: Zc11=10 Ω+j43Ω, and Zp11=10 Ω+j43Ω when the PA is on; and Zc11=6 Ω+j39Ω when the PA is off. It is to be noted that the obtainable characteristics are described with reference to FIGS. 4A, 4B, 5A, and 5B. For this reason, it is only necessary that: the inductance of series inductor 14 be set to 2.2 nH; the capacitance of parallel capacitor 15 be set to 1.4 pF; the inductance of series inductor 17 be set to 2.2 nH, and the capacitance of parallel capacitor 18 be set to 1.4 pF.

Figure 3:
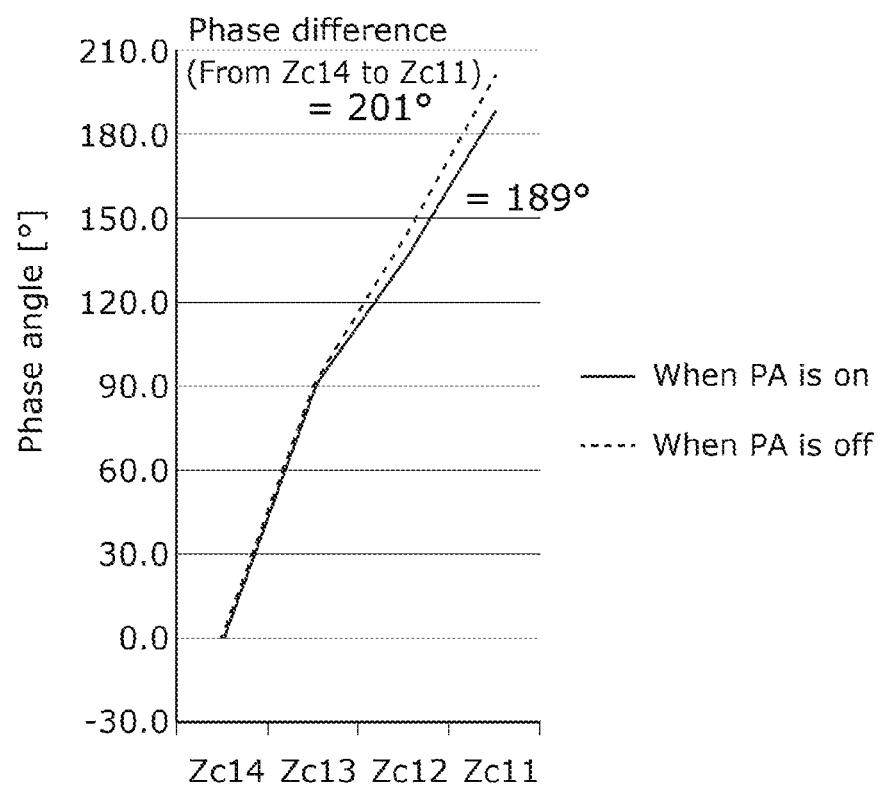
FIG. 3 is a diagram indicating a phase angle of a matching circuit included in the high-frequency amplifier according to the comparison example.

FIG. 2 illustrates Smith charts each indicating impedance conversion in high-frequency amplifier 10 according to the comparison example. More specifically, FIG. 2 indicates impedance conversion by first matching circuit 13 and first transmission line 20. When the PA illustrated in (a) of FIG. 2 is on, conversion from Zc14=50 Ω+j0Ω to Zc11=10 Ω+j43Ω is performed. Here, conversion from Zc14 to Zc13 is not performed with 50Ω maintained, because the characteristic impedance of first transmission line 20 is 50Ω. When the PA illustrated in (b) of FIG. 2 is off, conversion from Zc14=25 Ω+j0Ω to Zc11=6 Ω+j39Ω is performed. By first transmission line 20, conversion from Zc14=25 Ω+j0Ω to Zc13=100 Ω+j0Ω is performed, FIG. 3 is a diagram illustrating the phase angle of the matching circuit included in high-frequency amplifier 10 according to the comparison example. When the PA is on, the phase angle of Zc14 is 0°, the phase angle of Zc11 is 189°, and the phase difference between Zc14 and Zc11 is 189° (the solid line in FIG. 3). Likewise, when the PA is off, the phase difference between Zc14 and Zc11 is 201° (the broken line in FIG. 3). In either case, there is a large phase difference exceeding 180°. In this way, in high-frequency amplifier 10, since the phase difference from terminal X to carrier amplifier 11 is large, there is a problem that dispersion of Zc11 is large (the dispersion of Zc11 is described later with reference to FIG. 4A).

Figure 4A:
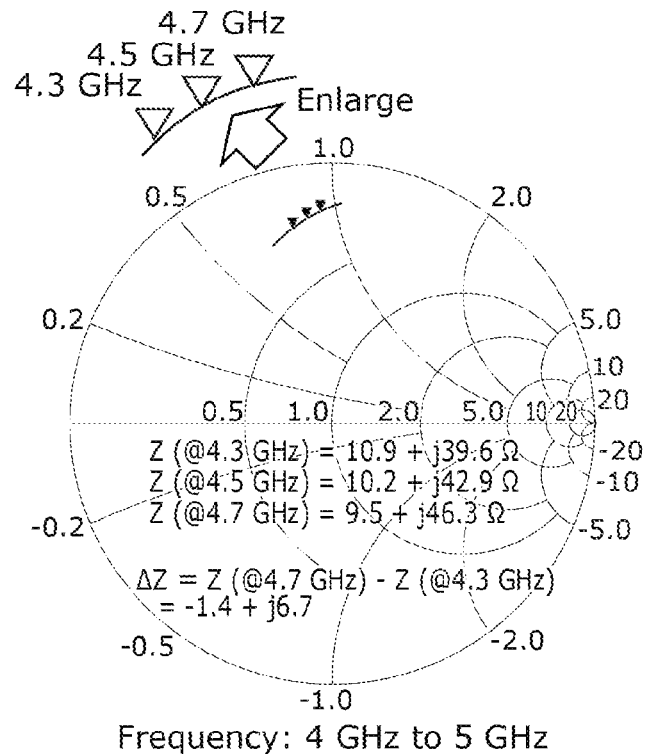
FIG. 4A is a Smith chart indicating Zc11 when a PA is on in the high-frequency amplifier according to the comparison example.

FIG. 4A is a Smith chart indicating the dispersion of Zc11 when the PA is on in high-frequency amplifier 10 according to the comparison example. FIG. 4A indicates the dispersion of Zc11 at frequencies 4.3 GHz, 4.5 GHz, and 4.7 GHz. When the dispersion of Zc11 is large, for example, when the optimum design is made to have center frequency 4.5 GHz, frequencies 4.3 GHz and 4.7 GHz at both ends are outside the optimum design, and the characteristics of high-frequency amplifier 10 at the frequencies decrease. When the variation amount of Zc11 (ΔZc11) from 4.3 GHz to 4.7 GHz is seen, ΔZc11=−1.4 Ω+j6.7Ω is satisfied.

Figure 4B:
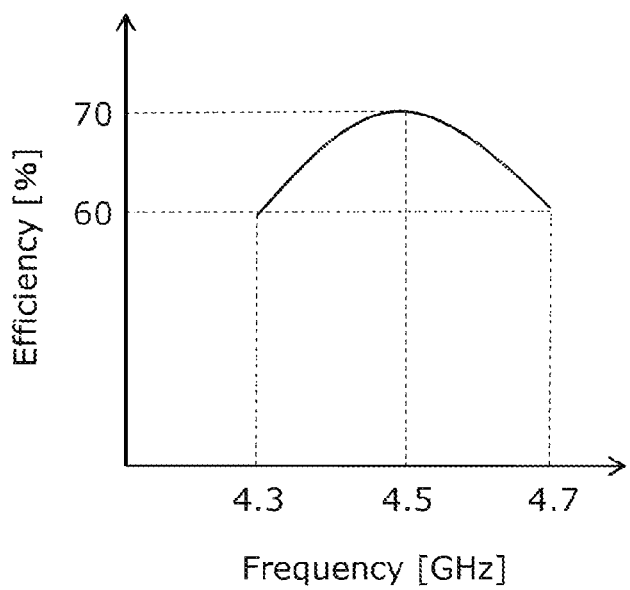
FIG. 4B is a diagram indicating frequency characteristics of efficiency when the PA is on in the high-frequency amplifier according to the comparison example.
Figure 5A:
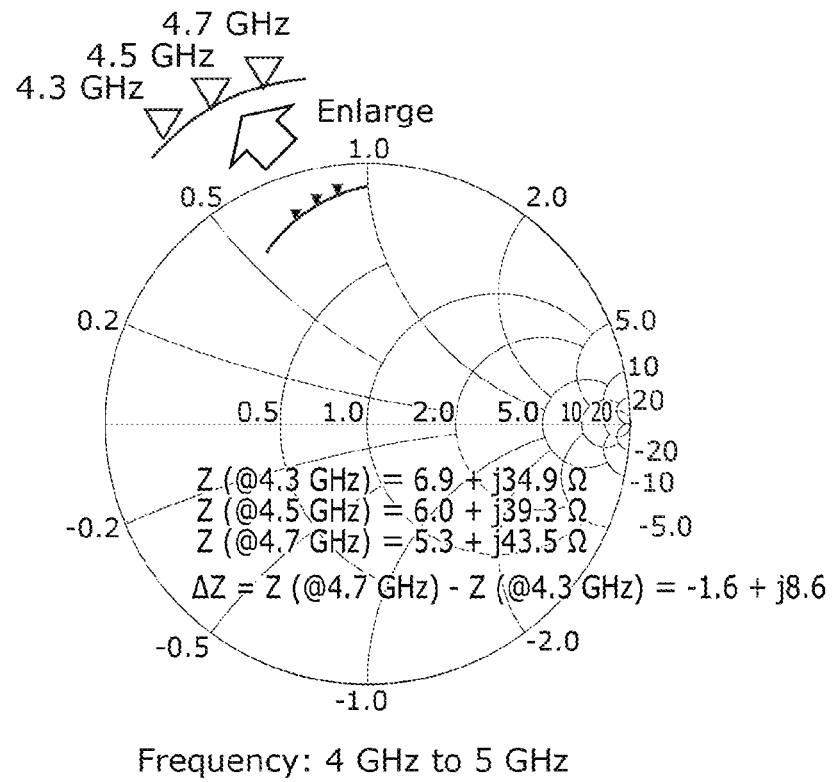
FIG. 5A is a Smith chart indicating Zc11 when the PA is off in the high-frequency amplifier according to the comparison example.
Figure 5B:
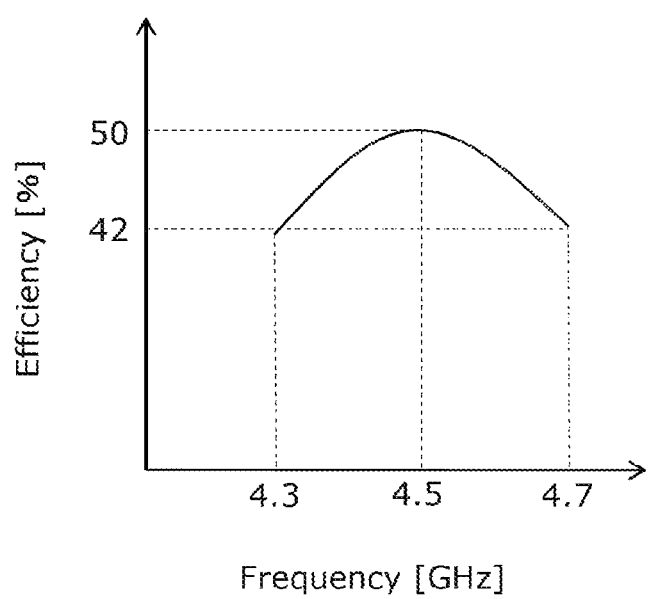
FIG. 5B is a diagram indicating frequency characteristics of efficiency when the PA is off in the high-frequency amplifier according to the comparison example.

FIG. 4B indicates frequency characteristics of efficiency when the PA is on in high-frequency amplifier 10 according to the comparison example. Although efficiency 70% is obtained at center frequency 4.5 GHz, the efficiency decreases to 60% at frequencies 4.3 GHz and 4.7 GHz at the both ends. This decrease in characteristics stems from the fact that ΔZc11 is large as indicated in FIG. 4A, FIG. 5A is a Smith chart indicating the dispersion of Zc11 when the PA is off in high-frequency amplifier 10 according to the comparison example. When ΔZc11 from frequency 4.3 GHz to frequency 4.7 GHz is seen, ΔZc11=−1.6 Ω+j8.6Ω is satisfied. In FIG. 5B, efficiency 50% is obtained at center frequency 4.5 GHz, the efficiency decreases to 42% at frequencies 4.3 GHz and 4.7 GHz at the both ends. This decrease in characteristics stems from the fact that ΔZc11 is large.

In view of this, a high high-frequency amplifier according to an embodiment of the present disclosure is an amplifier which amplifies a first signal and a second signal in a predetermined frequency band to output amplified signals from an output terminal. The high-frequency amplifier includes: a first amplifier which amplifies the first signal; a second amplifier which amplifies the second signal; a first matching circuit which is connected to an output terminal of the first amplifier; a second matching circuit which is connected to an output terminal of the second amplifier; a first transmission line which is connected between the output terminal of the first matching circuit and the output terminal of the second matching circuit, the first transmission line having an electric length that is less than ¼ of a wavelength of a center frequency of the predetermined frequency band; a second transmission line which is connected to one of an input terminal of the first amplifier or an input terminal of the second amplifier, the second transmission line having an electric length that is less than ¼ of the wavelength of the center frequency of the predetermined frequency band; and a third transmission line which is connected between one end of the first transmission line and the output terminal, the third transmission line having an electric length that is ¼ of the wavelength of the center frequency of the predetermined frequency band. In the high-frequency amplifier, a phase rotation by one of the first matching circuit or the second matching circuit connected to an other of the output terminal of the first amplifier and the output terminal of the second amplifier is opposite to a phase rotation by the first transmission line. In this way, the phase rotation by the first matching circuit is opposite to the phase rotation by the first transmission line, and thus the dispersion of load impedance of the carrier amplifier is reduced. Thus, the amplifier can operate in a wider frequency band, provide a higher efficiency, and be more compact than conventional ones.

Hereinafter, the embodiment of the present disclosure is explained using the drawings. It is to be noted that each of embodiments to be described below indicates one specific example of the present disclosure. Frequencies, impedances, characteristic impedances, constants of circuit components, materials, etc. indicated in the embodiments below are examples, and thus do not intend to limit the present disclosure. In addition, the respective diagrams are not always illustrated precisely. In the diagrams, substantially the same dements are assigned with the same reference signs, and overlapping descriptions may be omitted or simplified. Predetermined frequency bands are frequency bands for use in communication, and for example frequency bands up to 3 THz for use in radio communication.

Embodiment 1

FIG. 6 is a circuit diagram of high-frequency amplifier 30 according to Embodiment 1. High-frequency amplifier 30 is a Doherty amplifier which amplifies a first signal and a second signal in a predetermined frequency band (for example, a frequency band whose center frequency is 4.5 GHz) to output amplified signals from output terminal 22. High-frequency amplifier 30 includes carrier amplifier 11 which is an example of a first amplifier, peak amplifier 12 which is an example of a second amplifier, first matching circuit 33, second matching circuit 36, first transmission line 40, second transmission line 39, third transmission line 21, output terminal 22, first input terminal 23, and second input terminal 24, First matching circuit 33 includes series inductor 34 and parallel capacitor 35 whose one end is grounded. Second matching circuit 36 includes series inductor 37 and parallel capacitor 38 whose one end is grounded.

Carrier amplifier 11 and peak amplifier 12 for use in high-frequency amplifier 30 are each configured with, for example, a device which performs high-frequency amplification. The device is a FET, a BJT, or the like including GaN, GaAs, SiGe, Si, or the like. Transmission lines (first transmission line 40, second transmission line 39, and third transmission line 21) are, for example, microstrip lines or strip lines. The transmission lines are configured with a substrate material for use in a general high-frequency circuit that is a ceramic group, a resin group, or the like, and transmission paths which include a material such as Cu whose electrical characteristics are excellent and which is for transmitting high-frequency signals. In an actual circuit, parallel inductors 35 and 38 are grounded via a capacitor for grounding, the capacitor for grounding is not illustrated in the diagram. In addition, a line for supplying power from a power source is not illustrated.

Hereinafter, high-frequency amplifier 30 according to this embodiment is described focusing on differences from high-frequency amplifier 10 according to the comparison example. In high-frequency amplifier 10 according to the comparison example, first matching circuit 13 includes series inductor 14 and parallel capacitor 15 whose one end is grounded. In comparison, in high-frequency amplifier 30 according to this embodiment, first matching circuit 33 includes series inductor 34 and parallel inductor 35 whose one end is grounded. In addition, in high-frequency amplifier 10 according to the comparison example, second matching circuit 16 includes series inductor 17 and parallel capacitor 18 whose one end is grounded. In comparison, in high-frequency amplifier 30 according to this embodiment, second matching circuit 36 includes series inductor 37 and parallel inductor 38 whose one end is grounded. In addition, a "parallel inductor" is an inductor which is connected between a transmission path from an input terminal to an output terminal and a reference potential (that is, a ground potential).

Here, as for high-frequency amplifier 30 according to this embodiment, a description is given of a specific circuit constant in the case where GaN having a total gate width of 3 mm (that is, the same GaN as in high-frequency amplifier 10 according to the comparison example) is used for each of carrier amplifier 11 and peak amplifier 12.

Conditions for obtaining the optimum characteristics at frequency 4.5 GHz are the same as in high-frequency amplifier 10. The conditions are: $Zc21=10\ \Omega+j43\Omega$, and $Zp21=10\ \Omega+j43\Omega$ when the PA is on; and $Zc21=6\ \Omega+j39$ when the PA is off. To satisfy these conditions, it is only necessary that the inductance of series inductor 34 be set to 0.82 nH, the inductance of parallel inductor 35 be set to 0.89 nH, the inductance of series inductor 37 be set to 0.82 nH, and the inductance of parallel inductor 38 be set to 0.89 nH. It is excellent that the electric length of first transmission line 40 is set not to the ¼ wavelength but to less than the ¼ wavelength, and is set to a ¹⁄₁₀ wavelength of the center frequency of the predetermined frequency band here. In addition, the electric length of second transmission line 39 is set to the same electric length as the electric length of first transmission line 40, that is, to the ¹⁄₁₀ wavelength, in order to compensate the phase rotation by first transmission line 40. The characteristic impedance of first transmission line 40 and the characteristic impedance of second transmission line 39 are both 50Ω. Since the electric length of first transmission line 40 is shorter than in the comparison example, the dispersion of Zc21 is small, and the wide-band characteristics increase. In addition, loss in high-frequency power is small, and the efficiency of the amplifier increases. Furthermore, it is possible to reduce the size of the circuit.

FIG. 7 illustrates Smith charts each indicating impedance conversion in high-frequency amplifier 30 according to Embodiment 1. More specifically, FIG. 7 indicates impedance conversion by first matching circuit 33 and first transmission line 40. As illustrated in (a) of FIG. 7, conversion from Zc24=50 Ω+j0Ω to Zc21=10 Ω+j43Ω is performed when the PA is on. Seeing the details, the conversion from Zc24 to Zc23 is caused by first transmission line 40 whose characteristic impedance is 50Ω, and thus Zc24 and Zc23 are both 50Ω. The conversion from Zc23 to Zc22 is caused by parallel inductor 35 whose one end is grounded, and thus the rotation is a counterclockwise rotation. In (a) of FIG. 2, compared with the conversion from Zc13 to Zc12 performed in the clockwise rotation direction, the conversion from Zc23 to Zc22 is performed in the rotation direction opposite to the clockwise rotation direction. In addition, the conversion from Zc22 to Zc21 is caused by series inductor 34. In comparison with the conversion from Zc12 to Zc11 in (a) of FIG. 2, the inductance of series inductor 34 is reduced from 2.2 nH to 0.82 nH, and thus the amount of the conversion from Zc22 to Zc21 is small.

As illustrated in (b) of FIG. 7, conversion from Zc24=25 Ω+j0Ω to Zc21=6 Ω+j39Ω is performed when the PA is off. Seeing the details, in comparison with the amount of the conversion from Zc14 to Zc13 which corresponds to the ¼ wavelength and is caused by first transmission line 20 in (b) of FIG. 2, the amount of the conversion from Zc24 to Zc23 caused by first transmission line 40 corresponds to the ¹⁄₁₀ wavelength. The conversion from Zc23 to Zc22 is caused by parallel inductor 35 whose one end is grounded, and thus the rotation is a counterclockwise rotation. Compared with the conversion from Zc13 to Zc12 indicated in (b) of FIG. 2, the conversion from Zc23 to Zc22 is performed in a counterclockwise rotation. In addition, the conversion from Z22 to Z21 is caused by series inductor 34, and thus the amount of the conversion is small compared with the amount of the conversion from Zc12 to Zc11 in (b) of FIG. 2.

Figure 8:
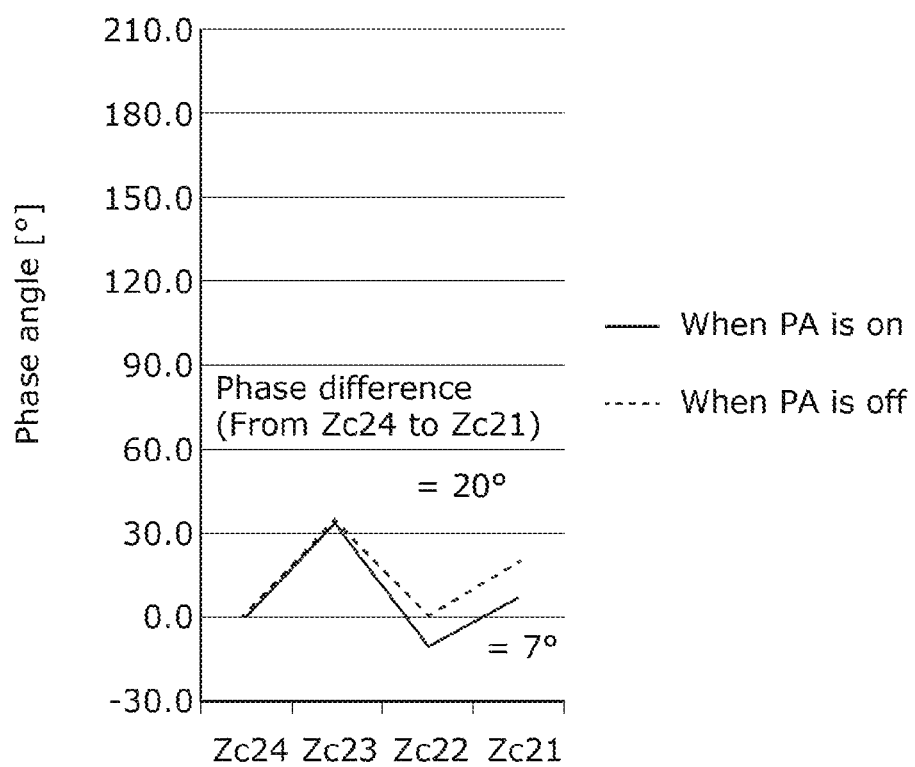
FIG. 8 is a diagram indicating a phase angle of a matching circuit included in the high-frequency amplifier according to Embodiment 1.

FIG. 8 is a diagram indicating phase angles of the matching circuit included in high-frequency amplifier 30 according to Embodiment 1. When the PA is on, the phase difference between Zc24 and Zc21 is only 7° (the solid line in FIG. 8), The phase difference is significantly reduced compared with phase difference 189° of high-frequency amplifier 10 according to the comparison example indicated in FIG. 3. In high-frequency amplifier 10 according to the comparison example, the phase difference by first transmission line 20 is 90°, and since the phase difference by first matching circuit 13 is added thereto, the sum of the phase differences is inevitably 90° or more. In comparison, in high-frequency amplifier 30 according to this embodiment, the sum of the phase difference by first matching circuit 33 and the phase difference by first transmission line 40 is less than 90°. It can be said that this is a clear difference. The factor is analyzed below.

Specifically, in high-frequency amplifier 30 according to this embodiment, the phase difference between Zc24 and Zc23 is 36°. The phase difference is significantly reduced compared with 90° that is the phase difference between Zc14 and Zc13. This is an effect of the length of first transmission line 40 being reduced to the ¹⁄₁₀ wavelength. The conversion by first matching circuit 33 is a phase rotation from Zc23 to Zc21, and the phase difference is −16° according to 20°-36°. The phase rotation by first matching circuit 33 is directionally opposite to the phase rotation by first transmission line 40, and thus has a function of compensating the phase difference of first transmission line 40, Seeing this more specifically, the reason why the phase difference by first matching circuit 33 is negative is that the phase difference by parallel inductor 35 whose one end is grounded is negative. The phase difference is −36° according to 0°-36° when the conversion from Zc23 to Zc22 is seen. In this way, including a constituent element having a phase rotation which is directionally opposite to the phase rotation of first transmission line 40 is effective for compensating the phase difference by first transmission line 40. The smallness of the phase difference between Zc22 and Zc21 reflects the smallness of the inductance of series inductor 37.

In the same diagram, also when the PA is off, in high-frequency amplifier 30 according to this embodiment, the phase difference between Zc24 and Zc21 is significantly reduced compared with the phase difference of high-frequency amplifier 10 according to the comparison example illustrated in FIG. 2 (the broken line in FIG. 8). The reasons for this include: that the length of first transmission line 40 is reduced as in the case where the PA is on; that first matching circuit 33 compensates the phase difference of first transmission line 40; that parallel inductor 35 which is a constituent element of first matching circuit 33 has a phase rotation which is directionally opposite to the phase rotation by first transmission line 40; and that the inductance of series inductor 37 is small.

Figure 9A:
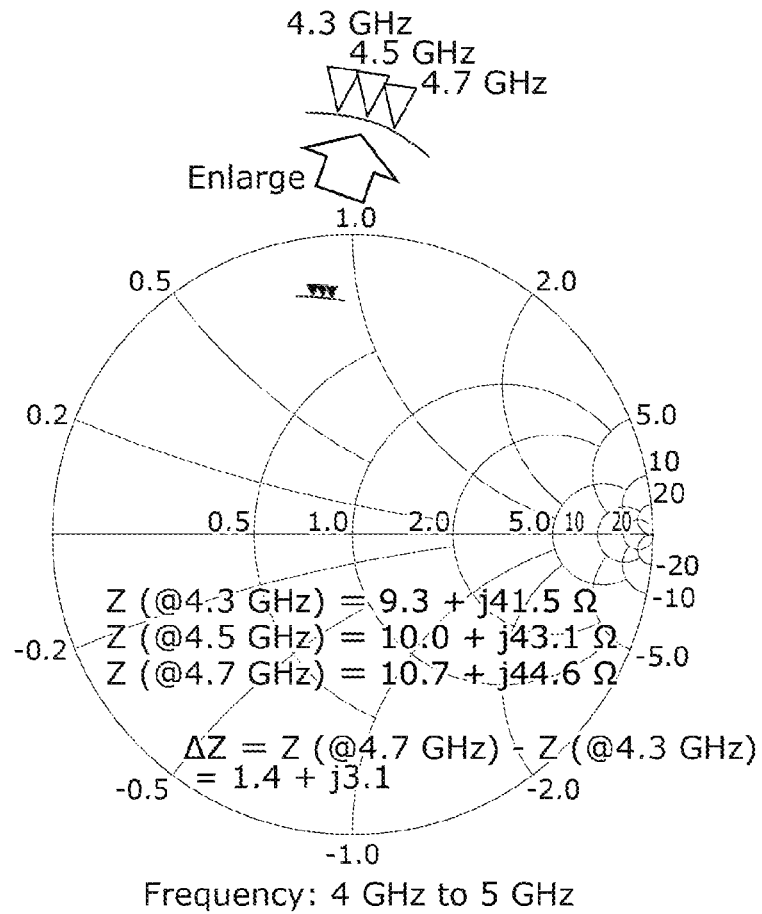
FIG. 9A is a Smith chart indicating Zc21 when a PA is on in the high-frequency amplifier according to Embodiment 1.

FIG. 9A is a Smith chart indicating the dispersion of Zc21 when the PA is on in high-frequency amplifier 30 according to Embodiment 1. FIG. 9A indicates the dispersion of Zc21 at frequencies 4.3 GHz, 4.5 GHz, and 4.7 GHz. Zc21 at each of the frequencies is a value according to a corresponding one of 9.3 Ω+j41.5Ω, 10.0 Ω+j43.1Ω, and 10.7 Ω+j44.6Ω. When ΔZc21 from frequency 4.3 GHz to 4.7 GHz is seen, ΔZc21=1.4 Ω+j3.1Ω is satisfied. The dispersion is reduced compared with the dispersion in high-frequency amplifier 10 according to the comparison example illustrated in FIG. 4A. This is because first matching circuit 33 compensates the phase rotation by first transmission line 40 as indicated in FIG. 8. In other words, first matching circuit 33 functions to reduce dispersion of Zc21 by first transmission line 40.

Figure 9B:
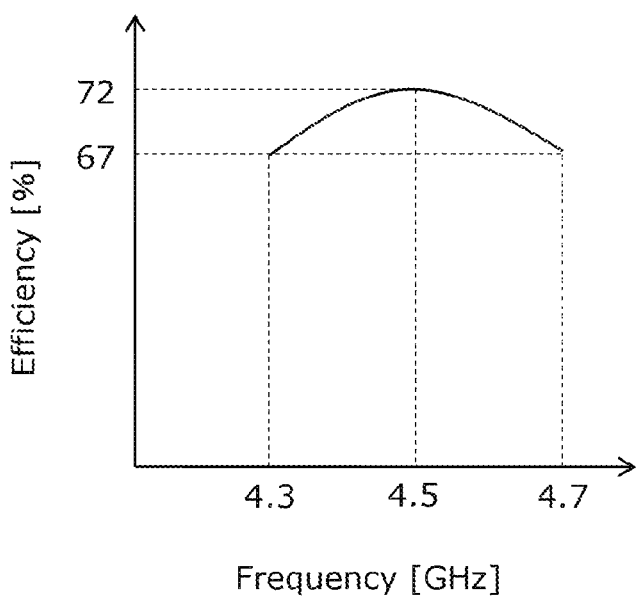
FIG. 9B is a diagram indicating frequency characteristics of efficiency when the PA is on in the high-frequency amplifier according to Embodiment 1.

FIG. 9B indicates frequency characteristics of efficiency when the PA is on in high-frequency amplifier 30 according to Embodiment 1, Although efficiency 72% is obtained at center frequency 4.5 GHz. As known through comparison with FIG. 4B, the efficiency is improved by 2% from the efficiency obtained by high-frequency amplifier 10 according to the comparison example. This is because the high-frequency loss is reduced by reducing the length of first transmission line 40. At frequencies 4.3 GHz and 4.7 GHz at the both ends, efficiency 67% is maintained. This is the effect of the reduction in dispersion of ΔZc21 as illustrated in FIG. 9A.

Figure 10A:
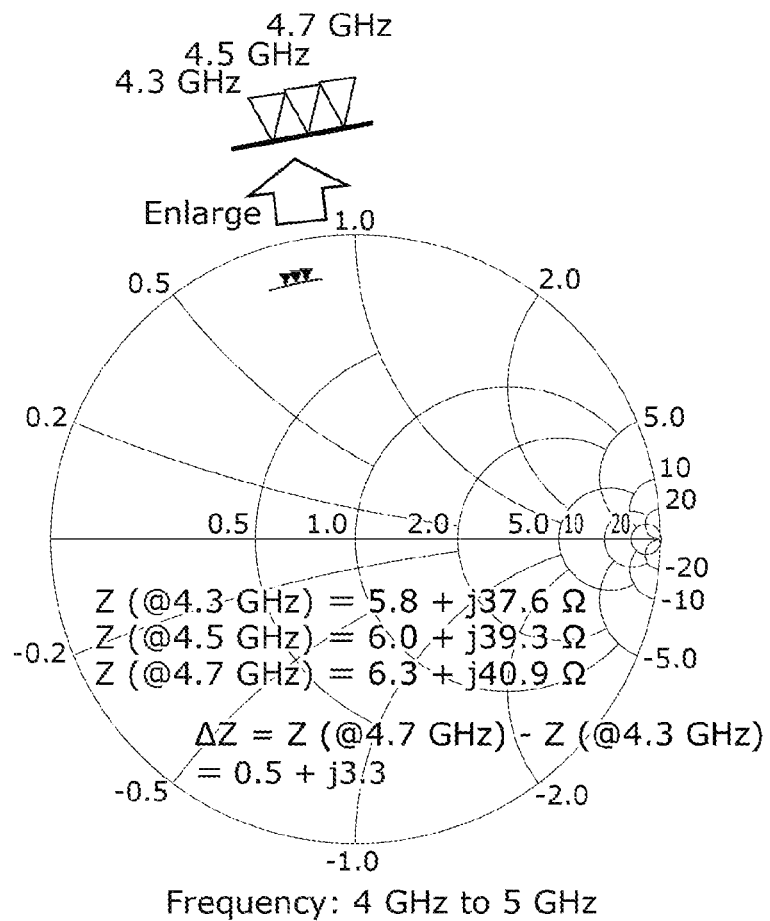
FIG. 10A is a Smith chart indicating Zc21 when the PA is on in the high-frequency amplifier according to Embodiment 1.

FIG. 10A is a Smith chart indicating dispersion of Zc21 when the PA is off in high-frequency amplifier 30 according to Embodiment 1. When ΔZc21 from frequency 4.3 GHz to 4.7 GHz is seen, ΔZc21=0.5 Ω+j3.3Ω is satisfied. The dispersion is reduced compared with the dispersion in high-frequency amplifier 10 according to the comparison example illustrated in FIG. 5A. In other words, first matching circuit 33 functions to reduce dispersion of Zc21 by first transmission line 40.

Figure 10B:
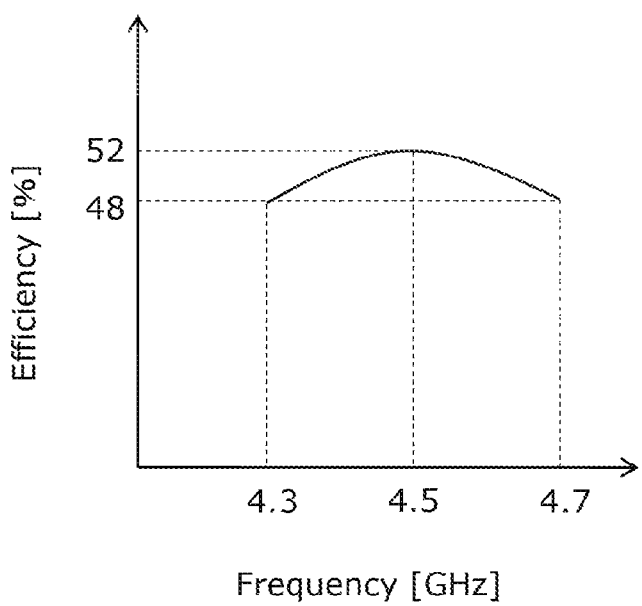
FIG. 10B is a diagram indicating frequency characteristics of efficiency when the PA is off in the high-frequency amplifier according to Embodiment 1.

FIG. 10B indicates frequency characteristics of efficiency when the PA is on in high-frequency amplifier 30 according to Embodiment 1, Although efficiency 52% is obtained at center frequency 4.5 GHz. As known through comparison with FIG. 43, the efficiency is improved by 2% from the efficiency obtained by high-frequency amplifier 10 according to the comparison example. This is because the high-frequency loss is reduced by reducing the length of first transmission line 40. At frequencies 4.3 GHz and 4.7 GHz at the both ends, efficiency 48% is maintained. This is the effect of the reduction in ΔZc21 as illustrated in FIG. 10A.

Although the electric length of first transmission line 40 is set to the ¹⁄₁₀ wavelength, it is to be noted that the same effect is provided as long as the electric length of first transmission line 40 is less than the ¼ wavelength. As an example, the electric length of first transmission line 40 is set to a ⅛ wavelength of the center frequency of the predetermined frequency band, other circuit constants are adjusted to the optimum ones, and dispersion of Zc21 is verified. When ΔZc21 from frequency 4.3 GHz to frequency 4.7 GHz is seen, ΔZc21=1.2 Ω+j4.5Ω is satisfied when the PA is on, and ΔZc21=0.3 Ω+j4.8Ω is satisfied when the PA is off. Also in the case where the electric length of first transmission line 40 is set to the ⅛ wavelength, the dispersion is reduced compared with the dispersion in high-frequency amplifier 10 according to the comparison example illustrated in FIG. 4A and FIG. 5A, The values of ΔZc21 in the respective cases where the electric lengths of first transmission line 40 are set to the 1/10 wavelength, the ⅛ wavelength, and the ¼ wavelength are indicated collectively in Table 1 below.

TABLE 1

| Electric length of first transmission line | 1/10 wavelength | 1/8 wavelength | 1/4 wavelength |
| --- | --- | --- | --- |
| When PA is on | 1.4 Ω + j3.1 Ω | 1.2 Ω + j4.5 Ω | −1.4 Ω + j6.7 Ω |
| When PA is off | 0.5 Ω + j3.3 Ω | 0.3 Ω + j4.8 Ω | −1.6 Ω + j8.6 Ω |

When the electric length of first transmission line 40 is set to less than the ¼ wavelength, ΔZc21 between when the PA is on and when the PA is off is reduced compared with ΔZc21 in high-frequency amplifier 10 according to the comparison example including first transmission line 20 whose electric length is the ¼ wavelength. As a result, high-frequency amplifier 30 according to this embodiment can be configured to operate in a wider frequency band, provide a higher efficiency, and be more compact than high-frequency amplifier 10 according to the comparison example.

As described above, high-frequency amplifier 30 according to this embodiment is a high-frequency amplifier which amplifies a first signal and a second signal in a predetermined frequency band to output amplified signals from output terminal 22. High-frequency amplifier 30 includes: a first amplifier which amplifies the first signal; a second amplifier which amplifies the second signal; first matching circuit 33 which is connected to an output terminal of the first amplifier; second matching circuit 36 which is connected to an output terminal of the second amplifier; first transmission line 40 which is connected between the output terminal of first matching circuit 33 and the output terminal of second matching circuit 36, first transmission line 40 having an electric length that is less than ¼ of a wavelength of a center frequency of the predetermined frequency band; second transmission line 39 which is connected to one of an input terminal of the first amplifier or an input terminal of the second amplifier (the second amplifier in this embodiment), second transmission line 39 having an electric length that is less than ¼ of the wavelength of the center frequency of the predetermined frequency band; and third transmission line 21 which is connected between one end of first transmission line 40 and output terminal 22, third transmission line 21 having an electric length that is ¼ of the wavelength of the center frequency of the predetermined frequency band. In the high-frequency amplifier, a phase rotation by one of first matching circuit 33 or second matching circuit 36 (first matching circuit 33 in this embodiment) connected to an other of the output terminal of the first amplifier and the output terminal of the second amplifier is opposite to a phase rotation by first transmission line 40.

In this way, since the electric length of first transmission line 40 is less than the ¼ wavelength, the loss of high-frequency power in first transmission line 40 is small, the efficiency of high-frequency amplifier 30 increases, and high-frequency amplifier 30 can be compact. Furthermore, a phase rotation by one of first matching circuit 33 or second matching circuit 36 (first matching circuit 33 in this embodiment) connected to an other of the output terminal of the first amplifier and the output terminal of the second amplifier is opposite to a phase rotation by first transmission line 40. Thus, the phase rotation by first transmission line 40 is compensated (that is, cancelled) by the one of first matching circuit 33 or second matching circuit 36 (first matching circuit 33 in this embodiment). Specifically, a sum of (i) an amount of phase rotation by the one of first matching circuit 33 or second matching circuit 36 (first matching circuit 33 in this embodiment) connected to the other of the output terminal of the first amplifier and the output terminal of the second amplifier and (ii) an amount of phase rotation by first transmission line 40 is less than 90°. Thus, the one of first matching circuit 33 or second matching circuit 36 (first matching circuit 33 in this embodiment) connected to the other of the output terminal of the first amplifier and the second amplifier is capable of reducing dispersion which is a frequency dependence of an impedance at an output side when seen from the output terminal of the first amplifier. Thus, the wide-band characteristics of the high-frequency amplifier increase.

Here, the first amplifier is carrier amplifier 11, and the second amplifier is peak amplifier 12. In this way, the Doherty amplifier which can operate in a wider frequency band, provide a higher efficiency, and be more compact than conventional ones is implemented.

In addition, first matching circuit 33 and second matching circuit 36 include a fourth transmission line and a fifth transmission line, respectively. The fourth transmission line and the fifth transmission line each have a grounded end. Here, at least one of the fourth transmission line or the fifth transmission line (the both in this embodiment) includes an inductor (parallel inductors 35 and 38). In this way, first matching circuit 33 or second matching circuit 36 (first matching circuit 33 in this embodiment) which causes a phase rotation in a direction opposite to the direction of a phase rotation by first transmission line 40 is easily implemented using the inductor.

It is to be noted that first matching circuit 33 and second matching circuit 36 have series inductor 34 and series inductor 37, respectively. In this way, first matching circuit 33 and second matching circuit 36 which cause a phase rotation in a direction opposite to the direction of a phase rotation by first transmission line 40 can be configured using at least the two inductors, respectively.

Embodiment 2

Figure 11:
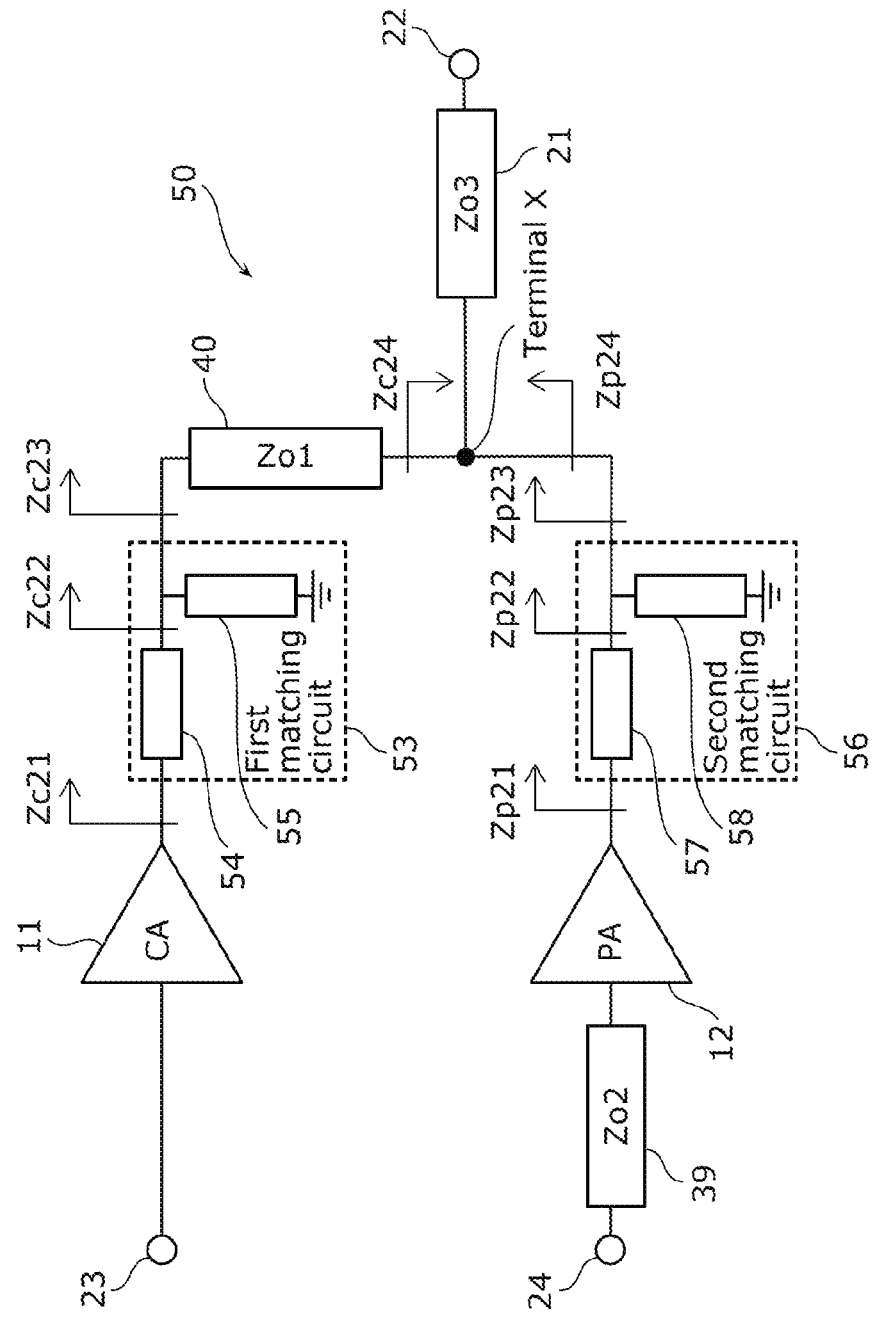
FIG. 11 is a circuit diagram of a high-frequency amplifier according to Embodiment 2.

FIG. 11 is a circuit diagram of high-frequency amplifier 50 according to Embodiment 2. Descriptions are given focusing on differences from high-frequency amplifier 30 according to Embodiment 1 illustrated in FIG. 6. High-frequency amplifier 50 illustrated in the diagram includes: fourth transmission line 55 whose one end is grounded instead of parallel inductor 35 illustrated in FIG. 6; and fifth transmission line 58 whose one end is grounded instead of parallel inductor 38 also in FIG. 6, As for fourth transmission line 55 and fifth transmission line 58, it is possible to obtain desired characteristics by setting the line length of each line to a 1/15 wavelength at frequency 4.5 GHz. In addition, in high-frequency amplifier 50 illustrated in the diagram, eighth transmission line 54 and ninth transmission line 57 having equivalent impedance conversion are used respectively instead of series inductor 34 and series inductor 37 illustrated in FIG. 6, It is to be noted that each of fourth transmission line 55, fifth transmission line 58, eighth transmission line 54, and ninth transmission line 57 is a microstrip line or a strip line.

The phase rotation by fourth transmission line 55 whose one end is grounded is equivalent to parallel inductor 35 whose one end is grounded, and it is possible to obtain impedance conversion similar to those indicated in FIGS. 7 and 8. In this way, inductors can be handled as kinds of transmission lines. Furthermore, high-frequency amplifier 50 is capable of obtaining efficiency characteristics similar to efficiency characteristics indicated in FIGS. 9A and 93, and FIGS. 10A and 10B, In addition, first matching circuit 53 and second matching circuit 56 include fourth transmission line 55 and fifth transmission line 58, respectively. Fourth transmission line 55 and fifth transmission line 58 each have a grounded end. In this way, first matching circuit 53 which causes a phase rotation opposite to the phase rotation by first transmission line 40 is easily implemented using fourth transmission line 55 such as a microstrip line.

Embodiment 3

Figure 12:
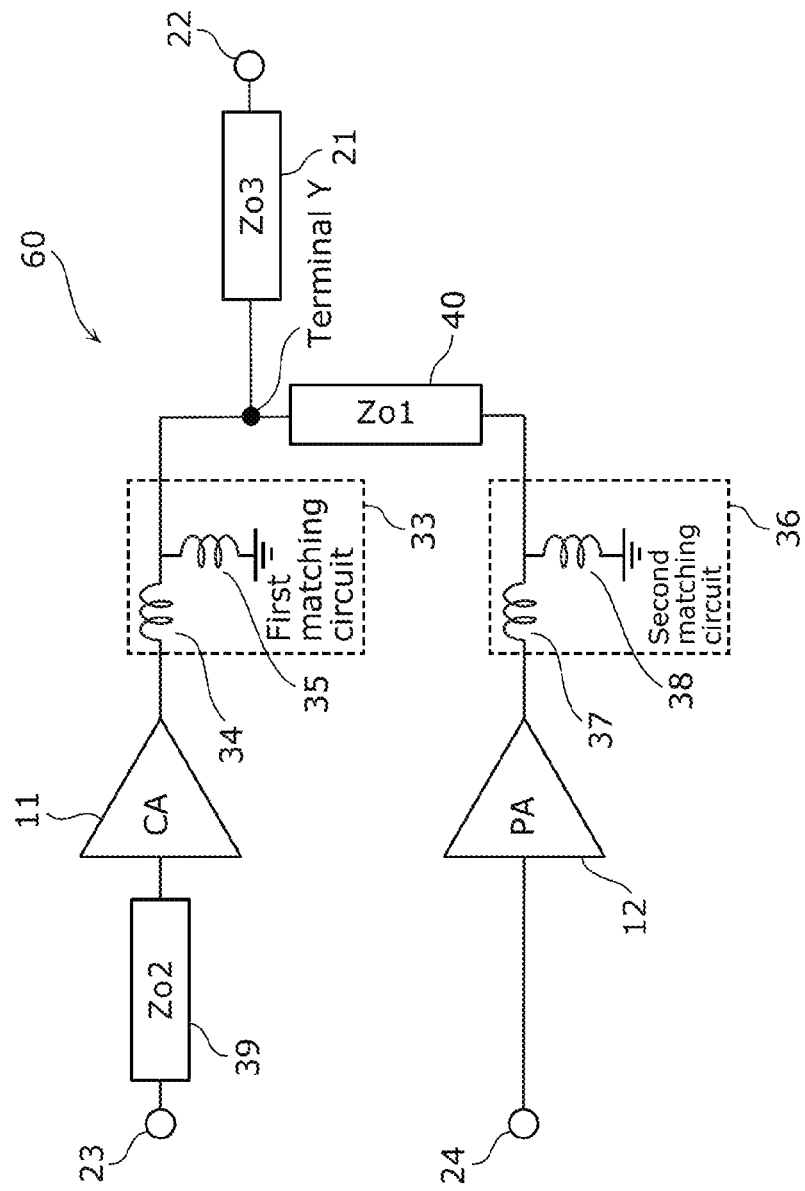
FIG. 12 is a circuit diagram of a high-frequency amplifier according to Embodiment 3.

FIG. 12 is a circuit diagram of high-frequency amplifier 60 according to Embodiment 3. In general, high-frequency amplifier 30 illustrated in FIG. 6 and high-frequency amplifier 60 illustrated in FIG. 12 may be distinguished from each other as a forward Doherty amplifier and as an inverse Doherty amplifier, respectively. Descriptions are given focusing on differences from high-frequency amplifier 30. The connection part between first transmission line 40 and first matching circuit 33 is assumed to be terminal Y. Third transmission line 21 is connected between terminal Y and output terminal 22. Second transmission line 39 is connected to the input side of carrier amplifier 11, and is set to have an electric length that is the same as the electric length of first transmission line 40 in order to compensate a phase rotation by first transmission line 40.

As for first transmission line 40, although a conventional inverse Doherty amplifier requires a transmission line having the ¼ wavelength, it is possible to reduce the wavelength to less than the ¼ wavelength in high-frequency amplifier 60 according to this embodiment. Furthermore, there are following features similar to those described with reference to FIG. 7 and FIG. 8: that second matching circuit 36 compensates the phase difference of first transmission line 40; that parallel inductor 38 having a grounded end which is a constituent element of second matching circuit 36 has a phase rotation which is directionally opposite to the phase rotation by first transmission line 40; and that the inductance of series inductor 37 is smaller than the inductance of the conventional inverse Doherty amplifier. As a result, also in high-frequency amplifier 60, it is possible to obtain efficiency characteristics similar to the efficiency characteristics indicated in FIGS. 9A and 9B, and FIGS. 10A and 10B by making the optimum settings to first matching circuit 33, second matching circuit 36, first transmission line 40, and second transmission line 39.

As described above, high-frequency amplifier 60 according to this embodiment is an inverse Doherty amplifier. Similarly to Embodiment 1, since the electric length of first transmission line 40 is less than the ¼ wavelength, the loss of high-frequency power in first transmission line 40 is small, the efficiency of high-frequency amplifier 30 increases, and high-frequency amplifier 60 can be compact. Furthermore, a phase rotation by one of first matching circuit 33 or second matching circuit 36 (second matching circuit 36 in this embodiment) connected to an other of the output terminal of the first amplifier and the output terminal of the second amplifier is opposite to a phase rotation by first transmission line 40, Thus, the phase rotation by first transmission line 40 is compensated (that is, cancelled) by the one of first matching circuit 33 or second matching circuit (first matching circuit 33 in this embodiment) Thus, the one of first matching circuit 33 or second matching circuit 36 (second matching circuit 36 in this embodiment) connected to the other of the output terminal of the first amplifier and the second amplifier is capable of reducing dispersion which is a frequency dependence of an impedance at an output side when seen from the output terminal of the second amplifier. Thus, the wide-band characteristics of the high-frequency amplifier increase.

Embodiment 4

Figure 13:
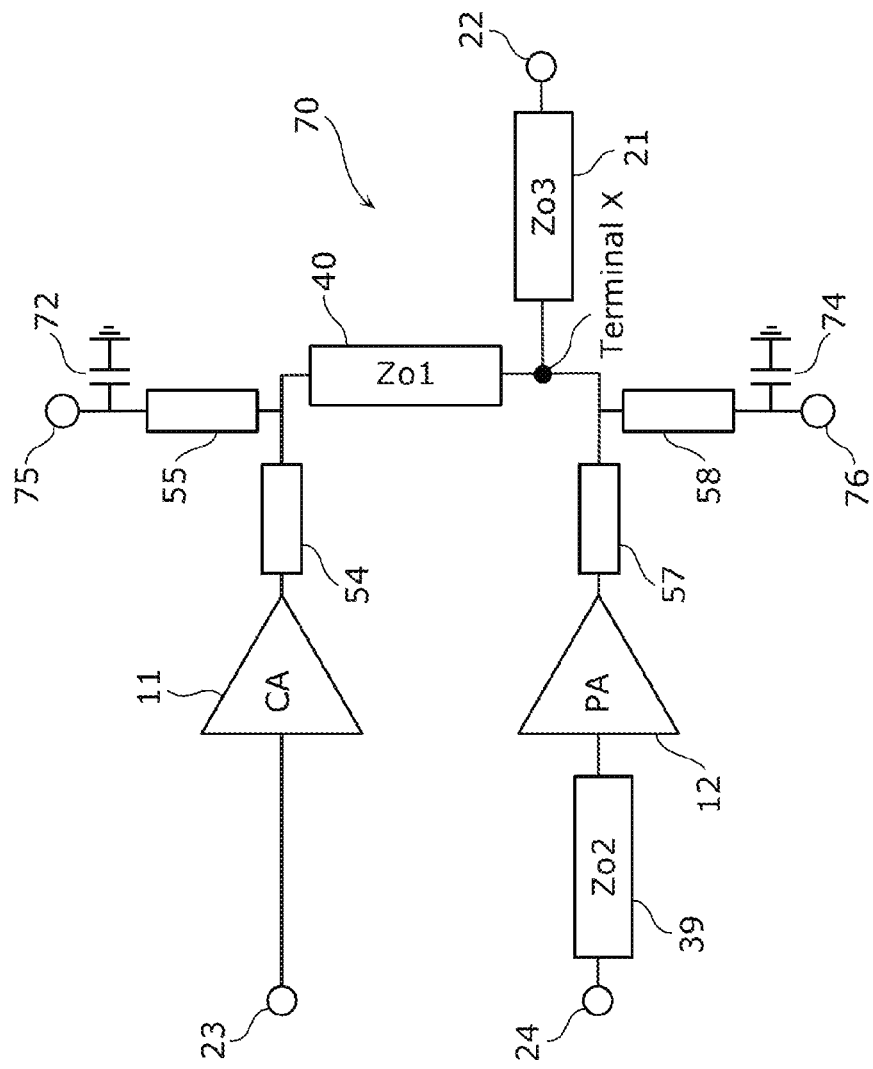
FIG. 13 is a circuit diagram of a high-frequency amplifier according to Embodiment 4.

FIG. 13 is a circuit diagram of high-frequency amplifier 70 according to Embodiment 4. In high-frequency amplifier 70, fourth transmission line 55 and fifth transmission line 58 are connected to power source terminal 75 and power source terminal 76, respectively. First capacitor 72 whose one end is grounded is connected between power source terminal 75 and fourth transmission line 55. Second capacitor 74 whose one end is grounded is connected between power source terminal 76 and fifth transmission line 58. In this way, fourth transmission line 55 and fifth transmission line 58 have one end grounded at high frequency. Thus, also in high-frequency amplifier 70, it is possible to obtain characteristics similar to those obtained by high-frequency amplifier 30 according to Embodiment 1. As such, it is possible to reduce the size of the circuit by utilizing fourth transmission line 55 and fifth transmission line 58 for the purposes of both impedance matching and supply of power from the power sources.

As described above, in addition to the configuration of high-frequency amplifier 50 according to Embodiment 2, high-frequency amplifier 70 according to this embodiment includes first capacitor 72 and second capacitor 74. First capacitor 72 is a capacitor which is for grounding one end of fourth transmission line 55 and is connected between the one end of fourth transmission line 55 and a reference potential, Second capacitor 74 is a capacitor which is for grounding one end of fifth transmission line 58 and is connected between the one end of fifth transmission line 58 and a reference potential. In this way, fourth transmission line 55 and fifth transmission line 58 are grounded at high frequency, and high-frequency amplifier 70 is capable of exerting the same effects as the effects exerted by high-frequency amplifier 50 according to Embodiment 2.

In addition, in high-frequency amplifier 70 according to this embodiment, at least one of fourth transmission line 55 or fifth transmission line 58 (the both in this embodiment) is used also in the application of supplying power from the power sources in addition to the application of impedance conversion. In this way, it is possible to reduce the number of circuit elements required for high-frequency amplifier 70, and thus to reduce the size of the circuit.

Embodiment 5

Figure 14:
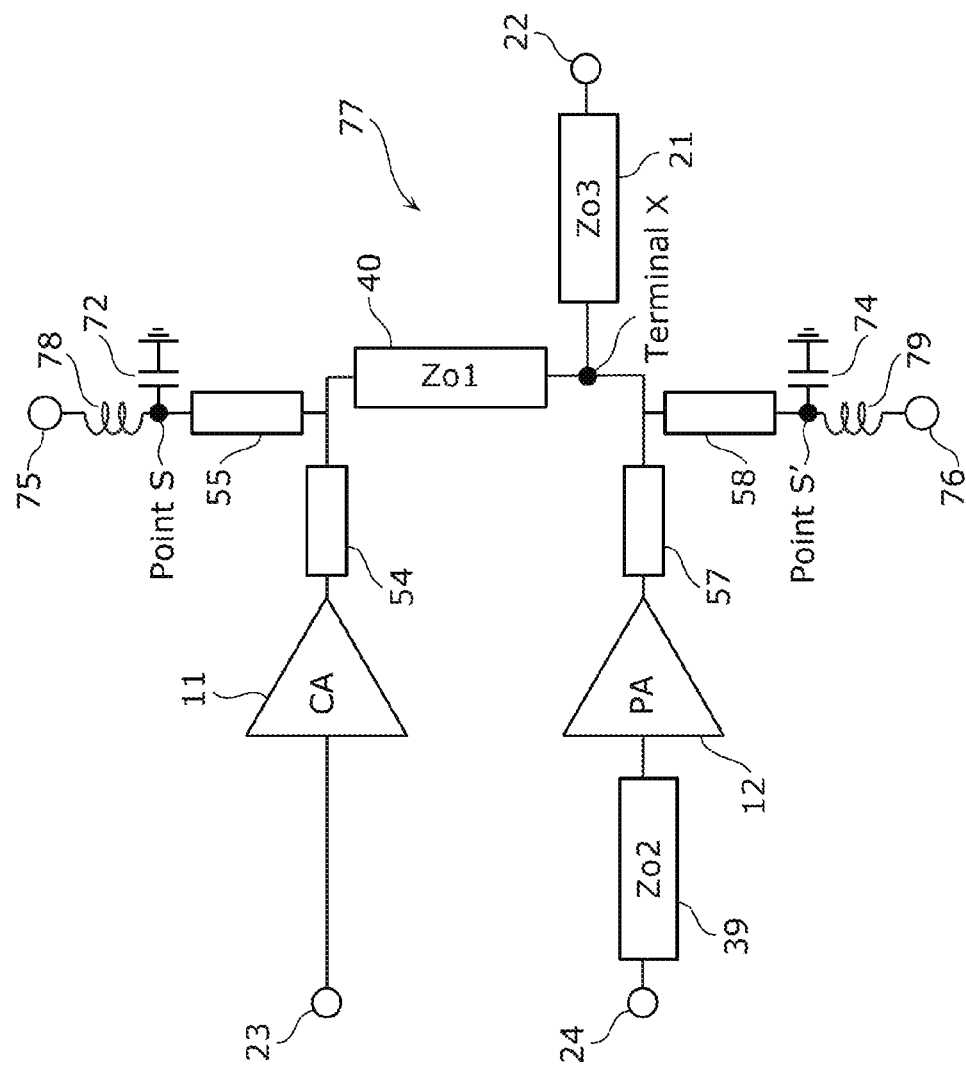
FIG. 14 is a circuit diagram of a high-frequency amplifier according to Embodiment 5.

FIG. 14 is a circuit diagram of high-frequency amplifier 77 according to Embodiment 5, High-frequency amplifier 77 is different from high-frequency amplifier 70 according to Embodiment 4 illustrated in FIG. 13 in that inductor 78 for a first power source is connected between power source terminal 75 and point S which is a connection point between fourth transmission line 55 and first capacitor 72. In high-frequency amplifier 70 according to Embodiment 4, the length of fourth transmission line 55 is selected by prioritizing impedance matching. Thus, when the length of fourth transmission line 55 is short, there is a problem that a high-frequency signal leaks from power source terminal 75 to the power source side. In this embodiment, as illustrated in FIG. 14, the use of inductor 78 for the first power source makes it possible to prevent leakage of a high-frequency signal. Likewise, inductor 79 for a second power source is connected between power source terminal 76 and point S' which is a connection point between fifth transmission line 58 and second capacitor 74. The use of inductor 79 for the second power source makes it possible to prevent leakage of a high-frequency signal to the power source side.

As described above, in addition to the configuration of high-frequency amplifier according to Embodiment 4, high-frequency amplifier 77 according to this embodiment includes inductor 78 for the first power source and inductor 79 for the second power source. Inductor 78 for the first power source is connected between the power source and the connection point between fourth transmission line 55 and first capacitor 72. Inductor 79 for the second power source is connected between the power source and the connection point between fifth transmission line 58 and second capacitor 74. In this way, it is possible to prevent leakage of the high-frequency signal from high-frequency amplifier 77 to the power source side.

[Regarding Load Impedances]

Figure 15:
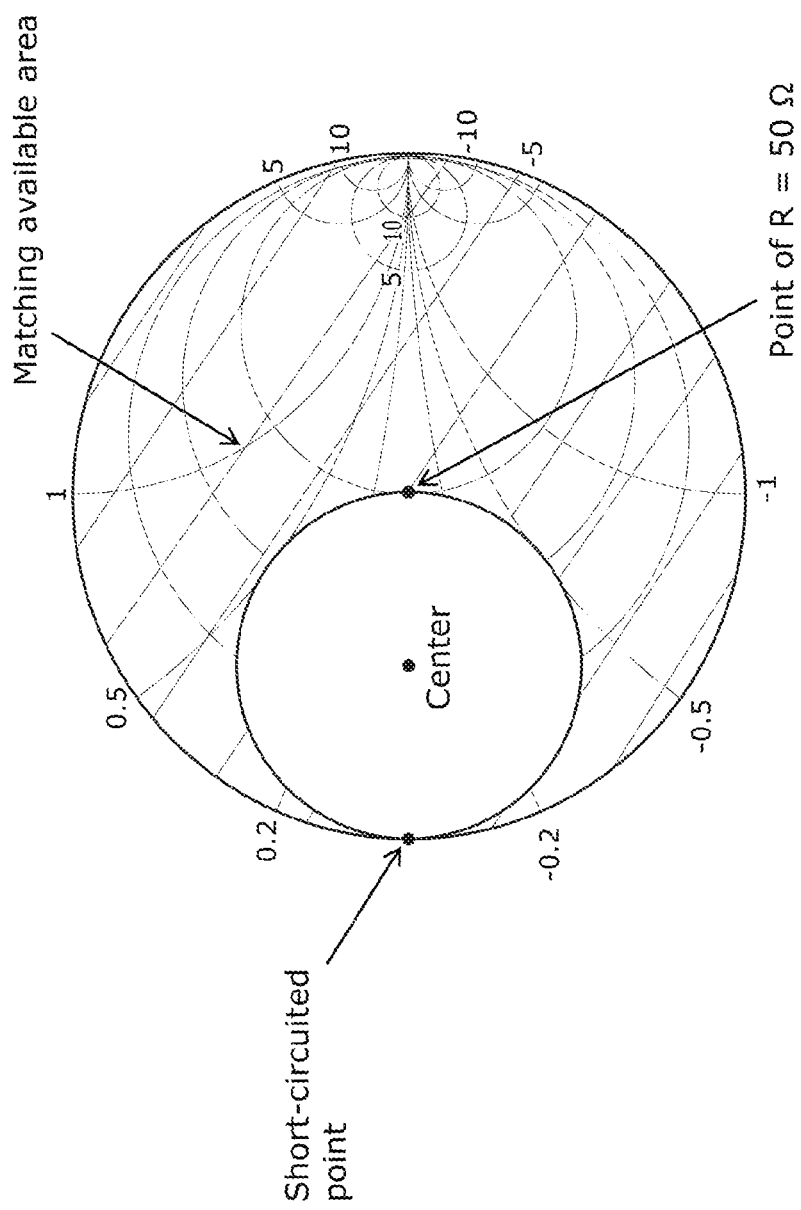
FIG. 15 is a Smith chart indicating a load impedance area in the high-frequency amplifier according to any of Embodiments 1 to 5.

The background that leads to the present disclosure is described using the Smith chart indicating a load impedance area in each of high-frequency amplifiers according to Embodiments 1 to 5, Here, a description is given with reference to Embodiment 1. High-frequency amplifier 30 illustrated in FIG. 6 is characterized in that parallel inductor 35 and parallel inductor 38 whose one end is grounded are used as first matching circuit 33 and as second matching circuit 36, respectively. First matching circuit 33 and second matching circuit 36 can be used only in the case where the load impedances of carrier amplifier 11 and peak amplifier 12 are in a matching available area (a hatched area) which is, as illustrated in FIG. 15, an area except inside of a circle which (i) has, as a center, a midpoint between a point of R=50Ω and a short-circuited point and (ii) passes through the point of R=50Ω and the short-circuited point (in short, the equal admittance circle which passes though the point of R=50Ω. In the Doherty amplifiers which have been studied mainly for high-output applications, amplifier loads are inside such circles because the sizes of the transistors handled are large. Thus, it has been impossible to use first matching circuit 33 and second matching circuit 36 which are included in high-frequency amplifier 30.

In the fifth-generation communication (so-called 5G) whose future development has been expected, the number of antennas to be used in a radio base station apparatus increases significantly (for example, from conventionally required four antennas to 256 antennas), In such radio base station apparatus, high-frequency signals to be output from a plurality of high-frequency amplifiers are output by beam forming using an array antenna, thus there is a tendency that the individual high-frequency amplifiers have low output power performances. Moreover, it becomes important that the amplifier to be used operates in a wider frequency band, provides a higher efficiency, and is more compact, more than ever before. In order to solve this problem, we have arrived at the high-frequency amplifier according to the present disclosure.

Here, a detailed description is given of a relationship between decrease in output power by a high-frequency amplifier and a high-frequency amplifier according to the present disclosure. The study by the Inventors have shown that, when FETs having a total gate width of 5 mm are used in the case where GaN FETs are used for high-frequency transistors, the optimum loads are within the matching available area illustrated in FIG. 15. The saturation power that is output by each GaN FET having the total gate width of 5 mm is 30 W. The saturation output by high-frequency amplifier 30 obtainable when the GaN FET is used for each of carrier amplifier 11 and peak amplifier 12 is 60 W. This can be said for all the high-frequency amplifiers disclosed in this Specification.

As described above, in the high-frequency amplifier according to this embodiment, at least one of an impedance at an output side when seen from the output terminal of the first amplifier or an impedance at an output side when seen from the output terminal of the second amplifier is outside the equal admittance circle which passes through a point that satisfies R=50Ω on the Smith chart. In order to satisfy this, it is desirable that each of the first amplifier and the second amplifier includes a FET formed using GaN, and a maximum high-frequency output power of the FET be less than or equal to 30 W. In this way, the high-frequency amplifier according to this embodiment can be used for a radio base station apparatus for applications such as the fifth-generation communication which outputs a high-frequency signal using an array antenna.

Embodiment 6

Figure 16:
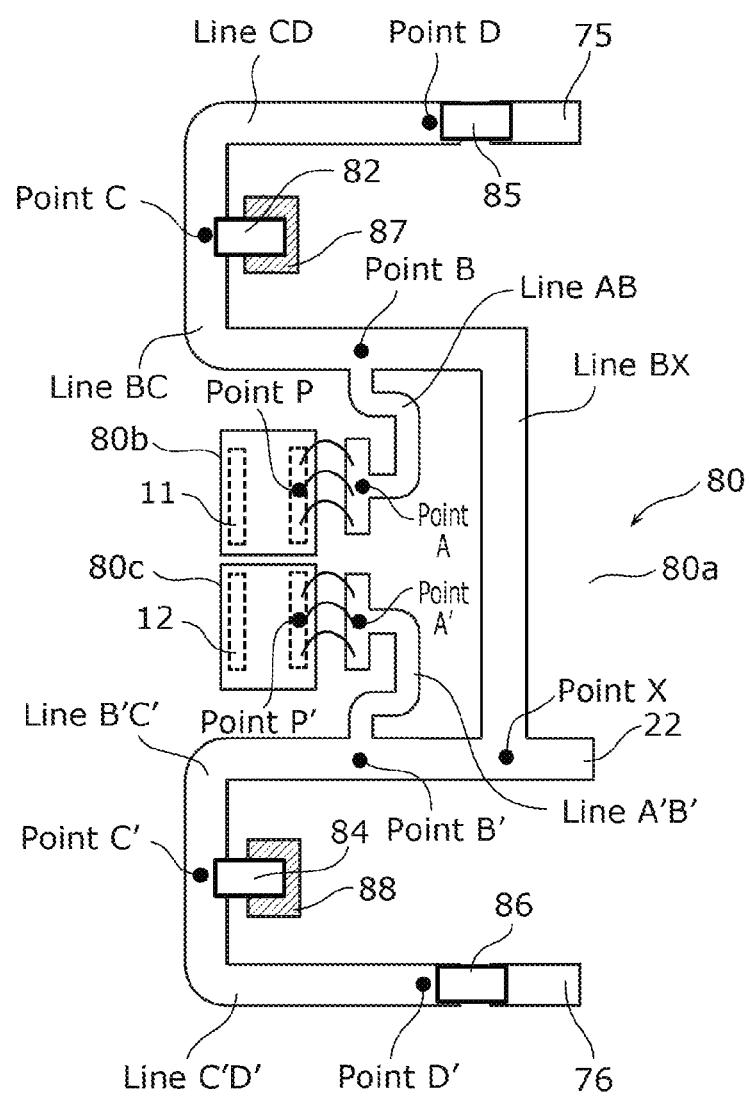
FIG. 16 is a layout diagram of a high-frequency amplifier according to Embodiment 6.

FIG. 16 is a layout diagram of high-frequency amplifier 80 according to Embodiment 6, High-frequency amplifier 80 according to this embodiment includes the same circuits as those in high-frequency amplifier 77 according to Embodiment 5 illustrated in FIG. 14. Thus, FIG. 16 corresponds to a specific layout on substrate 80a, regarding the circuit diagram of high-frequency amplifier 77 according to Embodiment 5 illustrated in FIG. 14.

The correspondences between FIG. 14 and FIG. 16 are as follows. Specifically, eighth transmission line 54 in FIG. 14 corresponds to line AB in FIG. 16. Likewise, fourth transmission line 55 in FIG. 14 corresponds to line BC in FIG. 16. In addition, first transmission line 40 in FIG. 14 corresponds to line BX in FIG. 16. First capacitor 72 for grounding in FIG. 14 is configured with component capacitor 82 whose one end is connected to grounding part 87 in FIG. 16, Inductor 78 for the first power source in FIG. 14 corresponds to a part at which two elements which are component inductor 85 and line CD which is an example of the sixth transmission line in FIG. 16 are connected. Here, using also line CD makes it possible to reduce the inductance of component inductor 85, and as a result, it is possible to increase a Q value of component inductor 85. The output terminal (point P) of carrier amplifier 11 and the input terminal (point A) of line AB are connected via a bonding wire. It is to be noted that carrier amplifier 11 is disposed on semiconductor chip 80b.

Likewise, ninth transmission line 57 in FIG. 14 corresponds to line A'S" in FIG. 16. Fifth transmission line 58 in FIG. 14 corresponds to line B'C' in FIG. 16. Second capacitor 74 for grounding in FIG. 14 is configured with component capacitor 84 whose one end is connected to grounding part 88 in FIG. 16. Inductor 79 for the second power source in FIG. 14 corresponds to a part at which two elements which are component inductor 86 and line C'D' which is an example of the seventh transmission line in FIG. 16 are connected. Here, using also line CD' makes it possible to reduce the inductance of component inductor 86, and as a result, it is possible to increase a Q value of component inductor 86. The output terminal (point P') of peak amplifier 12 and the input terminal (point A') of line A'B' are connected via a bonding wire. It is to be noted that peak amplifier 12 is disposed on semiconductor chip 80c.

As known from FIG. 16, in the layout of high-frequency amplifier 80 according to this embodiment, the following positions are designed to be line symmetric: (i) the positions of carrier amplifier 11 to power source terminal 75, specifically, chip 80b, line AB corresponding to eighth transmission line 54, line BC corresponding to fourth transmission line 55, line CD corresponding to the sixth transmission line, and (ii) the positions of peak amplifier 12 to power source terminal 76, specifically, chip 80c, line A'B' corresponding to ninth transmission line 57, line B'C' corresponding to fifth transmission line 58, line CD' corresponding to the seventh transmission line. In addition, line BX is implemented to have a 1/10 wavelength (approximately 3 mm at frequency 4.5 GHz on substrate 80a), and thus the length is short.

As described above, high-frequency amplifier 80 according to this embodiment is configured to include: component inductor 85 and line CD which is the example of the sixth transmission line instead of inductor 78 for the first power source in Embodiment 5; and component inductor 86 and line C'D' which is the example of the seventh transmission line instead of inductor 79 for the second power source in Embodiment 5. In other words, inductor 78 for the first power source in Embodiment 5 includes the sixth transmission line (line CD), and inductor 79 for the second power source in Embodiment 5 includes the seventh transmission line (line C'D').

In this way, it is possible to arrange transmission lines having line length shorter than conventional near carrier amplifier 11 and peak amplifier 12, and thus to reduce the circuit size of high-frequency amplifier 80.

Although semiconductor chip 80b on which carrier amplifier 11 is disposed and semiconductor chip 80c on which peak amplifier 12 is disposed are separate chips in this embodiment, it is to be noted that configurations are not limited to this, and both carrier amplifier 11 and peak amplifier 12 may be disposed on a same chip.

In addition, eighth transmission line 54, ninth transmission line 57, fourth transmission line 55, fifth transmission line 58, first transmission line 40, second transmission line 39 (not illustrated in FIG. 16) and third transmission line 21 may be made using a same material (such as copper).

Embodiment 7

Figure 17:
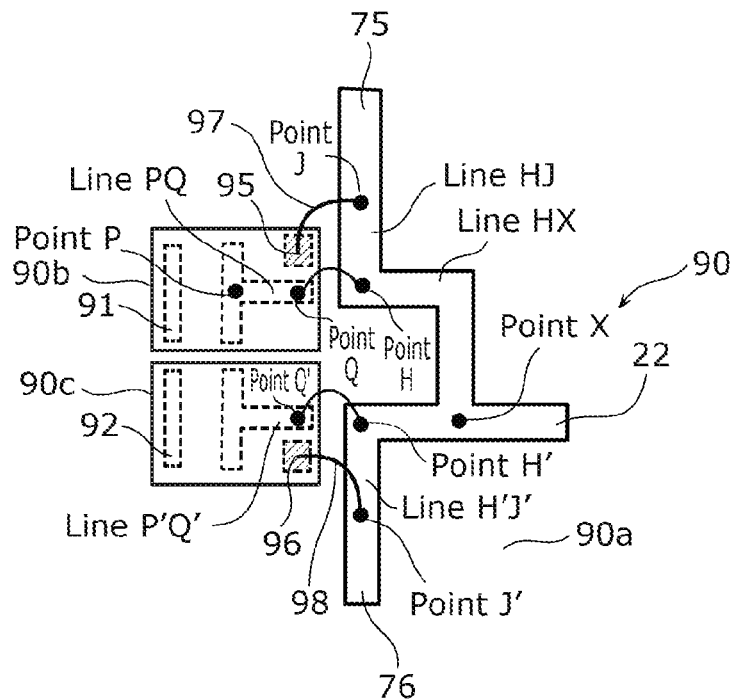
FIG. 17 is a layout diagram of a high-frequency amplifier according to Embodiment 7.

FIG. 17 is a layout diagram of high-frequency amplifier 90 according to Embodiment 7. High-frequency amplifier 90 according to this embodiment includes the same circuits as those in high-frequency amplifier 77 according to Embodiment 5 illustrated in FIG. 14. Thus, FIG. 17 corresponds to a specific layout on substrate 90a, regarding the circuit diagram of high-frequency amplifier 77 according to Embodiment 5 illustrated in FIG. 14.

In high-frequency amplifier 90 according to this embodiment, not only a FET as carrier amplifier 91 but also line PQ and first capacitor 95 are disposed on semiconductor chip 90b on which carrier amplifier 91 is disposed. One end of first capacitor 95 is connected to the ground on a rear face of semiconductor chip 90b via a through hole (not illustrated in FIG. 17). Likewise, not only a FET as peak amplifier 92 but also line P'Q' and second capacitor 96 are disposed on semiconductor chip 90c on which peak amplifier 92 is disposed. One end of second capacitor 96 is connected to the ground on a rear face of semiconductor chip 90c via a through hole (not illustrated in FIG. 17).

The correspondences between FIG. 14 and FIG. 17 are as follows. Specifically, eighth transmission line 54 in FIG. 14 corresponds to a part at which line PQ and a bonding wire between point Q and point H are connected in FIG. 17. Likewise, fourth transmission line 55 in FIG. 14 corresponds to line HJ in FIG. 17. First transmission line 40 in FIG. 14 corresponds to line HX in FIG. 17. First capacitor 72 for grounding in FIG. 14 corresponds to first capacitor 95 disposed on semiconductor chip 90b in FIG. 17. Likewise, ninth transmission line 57 in FIG. 14 is configured with line P'Q' and a bonding wire between point Q' and point H'. Fifth transmission line 58 in FIG. 14 corresponds to line H'J' in FIG. 17. Second capacitor 74 for grounding in FIG. 14 corresponds to second capacitor 96 disposed on semiconductor chip 90c in FIG. 17, In addition, the line between point 3 and power source terminal 75 in FIG. 17 corresponds to the sixth transmission line, and the line between point J' and power source terminal 76 in FIG. 17 corresponds to the seventh transmission line.

In a high frequency band of a millimeter waveband or above, a wavelength is short, and thus it is possible to dispose a transmission line on a semiconductor chip. In addition, the length of a bonding wire is significant compared with the wavelength, it is possible to configure part of a matching circuit using the bonding wire. In addition, a capacitor for grounding can be implemented using a small capacitance value in the high frequency band, and thus it is possible to dispose the capacitor for grounding on the semiconductor chip.

As described above, high-frequency amplifier 90 according to Embodiment 7 is an amplifier which amplifies a first signal and a second signal in a predetermined frequency band to output amplified signals from output terminal 22. The high-frequency amplifier includes: substrate 90a; one or two semiconductor chips mounted on substrate 90a (in this embodiment, semiconductor chips 90b and 90c); a first amplifier which is disposed on semiconductor chip 90b and amplifies the first signal; a second amplifier which is disposed on semiconductor chip 90c and amplifies the second signal; a part (line PQ) of eighth transmission line 54 which is disposed on semiconductor chip 90b and has one end connected to an output terminal of the first amplifier; a part (line P'Q') of ninth transmission line 57 which is disposed on semiconductor chip 90c and has one end connected to an output terminal of the second amplifier; first capacitor 95 disposed on semiconductor chip 90b; second capacitor 96 disposed on semiconductor chip 90c; fourth transmission line 55 (line HJ) which is disposed on substrate 90a and has one end connected to an other end of the part (line PQ) of eighth transmission line 54; fifth transmission line 58 (line H'J') which is disposed on substrate 90a and has one end connected to an other end of the part (line P'Q') of ninth transmission line 57; first transmission line 40 (line HX) which is connected between the one end (point H) of fourth transmission line 55 and the one end (point H') of fifth transmission line 58 which are disposed on substrate 90a, first transmission line 40 having an electric length that is less than 1/4 of a wavelength of a center frequency of the predetermined frequency band; second transmission line 39 (not illustrated in FIG. 17) which is connected to one of an input terminal of the first amplifier or an input terminal of the second amplifier, second transmission line 39 having an electric length that is less than ¼ of the wavelength of the center frequency of the predetermined frequency band; and third transmission line 21 (a transmission line between point X and output terminal 22) which is connected between the one end of first transmission line 40 (line HX) and output terminal 22, third transmission line 21 having an electric length that is ¼ of the wavelength of the center frequency of the predetermined frequency band. An other end of fourth transmission line 55 and first capacitor 95 are connected to each other, and an other end of fifth transmission line 58 and second capacitor 96 are connected to each other. More specifically, the other end of fourth transmission line 55 and first capacitor 95 are connected using first bonding wire 97, and the other end of fifth transmission line 58 and second capacitor 74 are connected using second bonding wire 98.

In this way, it is possible to configure parts of a matching circuits using bonding wires, Thus, the lengths of transmission lines required for the matching circuits are reduced. In addition, the capacitors for grounding are disposed on the semiconductor chips on which the amplifiers are disposed, and thus it is possible to design the amplifiers and capacitors as components independent from the other circuits.

Although semiconductor chip 90b on which carrier amplifier 91 is disposed and semiconductor chip 90c on which peak amplifier 92 is disposed are separate chips in this embodiment, it is to be noted that configurations are not limited to this, and both carrier amplifier 11 and peak amplifier 12 may be disposed on a same chip. In addition, eighth transmission line 54, ninth transmission line 57, fourth transmission line 55, fifth transmission line 58, first transmission line 40, second transmission line 39 (not illustrated in FIG. 17) and third transmission line 21 illustrated in FIG. 17 as examples may be made using a same material (such as copper).

Embodiment 8

Figure 18:
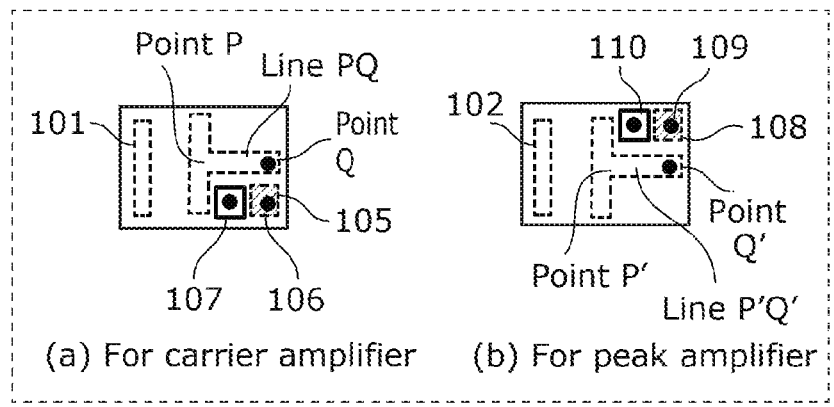
FIG. 18 illustrates a layout diagram of a semiconductor chip for a carrier amplifier and a layout diagram of a semiconductor chip for a peak amplifier included in a high-frequency amplifier according to Embodiment 8.

FIG. 18 illustrates a layout diagram of semiconductor chip 101 for a carrier amplifier according to Embodiment 8 ((a) of FIG. 18) and a layout diagram of semiconductor chip 102 for a peak amplifier according to Embodiment 8 ((b) of FIG. 18). Not only a FET for amplification but also line PQ and first capacitor 105 are disposed on semiconductor chip 101 for the carrier amplifier illustrated in (a) of FIG. 18. In addition, a bump is disposed at point Q which is the connection point of semiconductor chip 101 and an outside transmission line, a bump is disposed on upper electrode 106 which is one end of first capacitor 105, and a bump is disposed on lower electrode 107 which is the other end. Likewise, not only a FET for amplification but also line P'Q' and second capacitor 108 are disposed on semiconductor chip 102 for the peak amplifier illustrated in (b) of FIG. 18. In addition, a bump is disposed at point Q' which is the connection point of semiconductor chip 102 and an outside transmission line, a bump is disposed on upper electrode 109 which is one end of second capacitor 108, and a hump is disposed on lower electrode 110 which is the other end.

Figure 19:
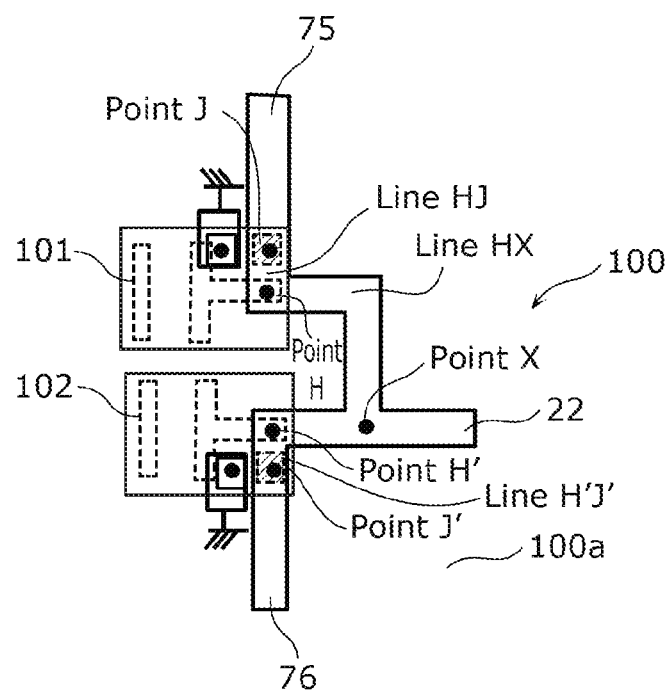
FIG. 19 is a layout diagram of the high-frequency amplifier according to Embodiment 8.

FIG. 19 is a layout diagram of high-frequency amplifier 100 according to Embodiment 8. High-frequency amplifier 100 according to this embodiment includes the same circuits as those in high-frequency amplifier 77 according to Embodiment 5 illustrated in FIG. 14. Thus, FIG. 19 corresponds to a specific layout on substrate 100a, regarding the circuit diagram of high-frequency amplifier 77 according to Embodiment 5 illustrated in FIG. 14.

As illustrated in the diagram, semiconductor chip 101 for the carrier amplifier and semiconductor chip 102 for the peak amplifier illustrated in FIG. 18 are mounted on substrate 100a by face-down bonding. Here, the mounting is performed in such a manner that the bump on point Q overlaps point H, the bump on upper electrode 106 overlaps point 3, the bump on point Q" overlaps point H', and the bump on upper electrode 109 overlaps point 3'. In addition, lower electrodes 107 and 110 which are the other ends of first capacitor 105 and second capacitor 108 are respectively grounded via substrate 100a.

The correspondences between FIG. 14 and FIG. 19 are as follows. Specifically, eighth transmission line 54 in FIG. 14 corresponds to line PQ in FIG. 19. Likewise, fourth transmission line 55 in FIG. 14 corresponds to line HJ in FIG. 19. In addition, first transmission line 40 in FIG. 14 corresponds to line HX in FIG. 19. Likewise, ninth transmission line 57 in FIG. 14 is configured with line P'Q' in FIG. 19. Likewise, fifth transmission line 58 in FIG. 14 corresponds to line WY in FIG. 19.

In this way, semiconductor chip 101 for the carrier amplifier has a bump which is a first conductor disposed in the area in which at least part of semiconductor chip 101 overlaps the other end (that is point 3) of fourth transmission line 55 in a plan view, and semiconductor chip 102 for the peak amplifier has a bump which is a second conductor disposed in the area in which at least part of semiconductor chip 102 overlaps the other end (that is point 3') of fifth transmission line 58 in the plan view. The other end (that is point 3) of fourth transmission line 55 and first capacitor 72 are connected via the bump which is the first conductor, and likewise, the other end (that is point J') of fifth transmission line 58 and second capacitor 74 are connected via the bump which is the second conductor.

In Embodiment 7, the parts of the matching circuits are configured using first bonding wire 97 and second bonding wire 98. However, further increase in frequency makes it difficult to perform matching because the inductances of the bonding wires are too large. In the case, the inductances of the bumps are much smaller than the inductances of the bonding wires, it is excellent to make contact with an outside circuit using the bumps instead of the bonding wires.

Although the high-frequency amplifiers according to the present disclosure have been described based on Embodiments 1 to 8 above, the present disclosure is not limited to Embodiments 1 to 8. The present disclosure covers and encompasses embodiments that a person skilled in the art may arrive at by adding various kinds of modifications to the above embodiments or by arbitrarily combining some of the constituent elements in the embodiments within the scope of the present disclosure.

For example, although the high-frequency amplifier in each of the above embodiments are designed assuming that a target load impedance is 50Ω, target load impedances are not limited to 50Ω, and a high-frequency amplifier may be designed assuming that a target load impedance is another load impedance such as 75Ω. In the case, it is only necessary to match the characteristic impedances of the respective transmission lines included in the high-frequency amplifier with the target load impedance.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The high-frequency amplifiers according to the present disclosure is available as a Doherty amplifier and an inverse Doherty amplifiers which are compact and highly efficient, and operate in a wide frequency band, and which is for use in radio communication. More specifically, the high-frequency amplifier is available as a high-frequency amplifier for radio base station apparatus for the fifth generation communication.

The invention claimed is:

1. A high-frequency amplifier which amplifies a first signal and a second signal in a predetermined frequency band to output amplified signals from an output terminal, the high-frequency amplifier comprising:
   a first amplifier which amplifies the first signal;
   a second amplifier which amplifies the second signal;
   a first matching circuit which is connected to an output terminal of the first amplifier;
   a second matching circuit which is connected to an output terminal of the second amplifier;
   a first transmission line which is connected between an output terminal of the first matching circuit and an output terminal of the second matching circuit, the first transmission line having an electric length that is less than ¼ of a wavelength of a center frequency of the predetermined frequency band;
   a second transmission line which is connected to an input terminal of the second amplifier, the second transmission line having an electric length that is less than ¼ of the wavelength of the center frequency of the predetermined frequency band; and
   a third transmission line which is connected between one end of the first transmission line and the output terminal of the high-frequency amplifier, the third transmission line having an electric length that is ¼ of the wavelength of the center frequency of the predetermined frequency band,
   wherein the first matching circuit includes:
      a series inductor which has one end connected to the output terminal of the first amplifier; and
      a parallel inductor which is a fourth transmission line that has one end connected to an other end of the series inductor and an other end that has been grounded, and
      a sum of an amount of phase rotation by the first matching circuit and an amount of phase rotation by the first transmission line is less than 90°, and
   the electric length of the first transmission line is less than or equal to ⅛ of the wavelength of the center frequency of the predetermined frequency band.

2. The high-frequency amplifier according to claim 1, wherein an impedance at an output side when seen from the output terminal of the first amplifier is outside an equal admittance circle which passes through a point that satisfies R=50Ω on a Smith chart.

3. The high-frequency amplifier according to claim 1, wherein the first amplifier includes a Field Effect Transistor (FET) formed using GaN, the FET having a maximum high-frequency output that is less than or equal to 30 W.

4. The high-frequency amplifier according to claim 3, wherein the high-frequency amplifier is used in a radio base station apparatus that outputs a high-frequency signal using an array antenna.

5. The high-frequency amplifier according to claim 1, further comprising:
   a capacitor connected between the other end of the fourth transmission line and a ground potential.

6. The high-frequency amplifier according to claim 1, further comprising:
   a substrate;
   one or two semiconductor chips which are mounted on the substrate, and on which the first amplifier and the second amplifier are disposed; and
   a first capacitor and a second capacitor which are disposed on the substrate and are component capacitors,
   wherein the first matching circuit includes:
      an eighth transmission line which is disposed on the substrate and has one end connected to the output terminal of the first amplifier; and
      the fourth transmission line which is disposed on the substrate and has the one end connected to an other end of the eighth transmission line,
   the second matching circuit includes:
      a ninth transmission line which is disposed on the substrate and has one end connected to the output terminal of the second amplifier; and
      a fifth transmission line which is disposed on the substrate and has one end connected to an other end of the ninth transmission line,
   the first transmission line is disposed on the substrate and connected between the one end of the fourth transmission line and the one end of the fifth transmission line,
   the other end of the fourth transmission line and the first capacitor are directly connected to each other, and
   an other end of the fifth transmission line and the second capacitor are directly connected to each other.

7. A high-frequency amplifier which amplifies a first signal and a second signal in a predetermined frequency band to output amplified signals from an output terminal, the high-frequency amplifier comprising:
   a first amplifier which amplifies the first signal;
   a second amplifier which amplifies the second signal;
   a first matching circuit which is connected to an output terminal of the first amplifier;
   a second matching circuit which is connected to an output terminal of the second amplifier;
   a first transmission line which is connected between an output terminal of the first matching circuit and an output terminal of the second matching circuit, the first transmission line having an electric length that is less than ¼ of a wavelength of a center frequency of the predetermined frequency band;
   a second transmission line which is connected to an input terminal of the second amplifier, the second transmission line having an electric length that is less than ¼ of the wavelength of the center frequency of the predetermined frequency band; and
   a third transmission line which is connected between one end of the first transmission line and the output terminal of the high-frequency amplifier, the third transmission line having an electric length that is ¼ of the wavelength of the center frequency of the predetermined frequency band;
   wherein the first matching circuit includes:
      a series inductor which has one end connected to the output terminal of the first amplifier; and a parallel inductor which is a fourth transmission line that has one end connected to an other end of the series inductor and an other end that has been grounded, and a sum of an amount of phase rotation by the first matching circuit and an amount of phase rotation by the first transmission line is less than 90°, the high-frequency amplifier further comprising:

a capacitor connected between the other end of the fourth transmission line and a ground potential, and an inductor for a power source, the inductor being connected between the power source and a connection point between the fourth transmission line and the capacitor.

8. The high-frequency amplifier according to claim 7, wherein the inductor for the power source includes a component inductor and a transmission line.

9. A high-frequency amplifier which amplifies a first signal and a second signal in a predetermined frequency band to output amplified signals from an output terminal, the high-frequency amplifier comprising:

a first amplifier which amplifies the first signal;

a second amplifier which amplifies the second signal;

a first matching circuit which is connected to an output terminal of the first amplifier;

a second matching circuit which is connected to an output terminal of the second amplifier;

a first transmission line which is connected between an output terminal of the first matching circuit and an output terminal of the second matching circuit, the first transmission line having an electric length that is less than ¼ of a wavelength of a center frequency of the predetermined frequency band;

a second transmission line which is connected to an input terminal of the second amplifier, the second transmission line having an electric length that is less than ¼ of the wavelength of the center frequency of the predetermined frequency band; and a third transmission line which is connected between one end of the first transmission line and the output terminal of the high-frequency amplifier, the third transmission line having an electric length that is ¼ of the wavelength of the center frequency of the predetermined frequency band, wherein the first matching circuit includes:

a series inductor which has one end connected to the output terminal of the first amplifier; and a parallel inductor which is a fourth transmission line that has one end connected to an other end of the series inductor and an other end that has been grounded, and a sum of an amount of phase rotation by the first matching circuit and an amount of phase rotation by the first transmission line is less than 90° the high-frequency amplifier further comprising:

a substrate;

one or two semiconductor chips which are mounted on the substrate, and on which the first amplifier and the second amplifier are disposed; and a first capacitor and a second capacitor disposed on the one or two semiconductor chips, wherein the first matching circuit includes:

an eighth transmission line which is disposed on the one or two semiconductor chips and has one end connected to the output terminal of the first amplifier; and the fourth transmission line which is disposed on the substrate and has the one end connected to an other end of the eighth transmission line, the second matching circuit includes:

a ninth transmission line which is disposed on the one or two semiconductor chips and has one end connected to the output terminal of the second amplifier; and a fifth transmission line which is disposed on the substrate and has one end connected to an other end of the ninth transmission line, the first transmission line is disposed on the substrate and connected between the one end of the fourth transmission line and the one end of the fifth transmission line, the other end of the fourth transmission line and the first capacitor are connected to each other, and an other end of the fifth transmission line and the second capacitor are connected to each other.

10. The high-frequency amplifier according to claim 9, wherein the other end of the fourth transmission line and the first capacitor are connected by a first bonding wire, and the other end of the fifth transmission line and the second capacitor are connected by a second bonding wire.

11. The high-frequency amplifier according to claim 9, wherein the one or two semiconductor chips include:

a first conductor disposed in an area in which at least part of the one or two semiconductor chips overlaps the other end of the fourth transmission line, in a plan view of the substrate; and a second conductor disposed in an area in which at least part of the one or two semiconductor chips overlaps the other end of the fifth transmission line, in the plan view, the other end of the fourth transmission line and the first capacitor are connected to each other via the first conductor, and the other end of the fifth transmission line and the second capacitor are connected to each other via the second conductor.

* * * * *